(12) United States Patent
Song et al.

(10) Patent No.: US 12,191,332 B2
(45) Date of Patent: Jan. 7, 2025

(54) IMAGE SENSOR AND SEMICONDUCTOR DEVICE INCLUDING ASYMMETRIC ACTIVE REGION

(71) Applicant: SAMSUNG ELECTRONICS CO., LTD., Suwon-si (KR)

(72) Inventors: Taeyoung Song, Hwaseong-si (KR); Sung In Kim, Hwaseong-si (KR); Haesung Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 463 days.

(21) Appl. No.: 17/526,424

(22) Filed: Nov. 15, 2021

(65) Prior Publication Data
US 2022/0208818 A1 Jun. 30, 2022

(30) Foreign Application Priority Data
Dec. 30, 2020 (KR) .......................... 10-2020-0187337

(51) Int. Cl.
*H01L 27/146* (2006.01)
*H04N 25/778* (2023.01)

(52) U.S. Cl.
CPC .............. *H01L 27/14616* (2013.01); *H01L 27/14603* (2013.01); *H01L 27/1463* (2013.01); *H04N 25/778* (2023.01)

(58) Field of Classification Search
CPC ......... H01L 27/14616; H01L 27/14603; H01L 27/1463; H04N 25/778
See application file for complete search history.

(56) References Cited

U.S. PATENT DOCUMENTS

| | | | |
|---|---|---|---|
| 8,405,153 B2 | 3/2013 | Jang | |
| 8,947,950 B2 | 2/2015 | Chae et al. | |
| 9,711,548 B2 | 7/2017 | Hung et al. | |
| 9,773,796 B2 | 9/2017 | Lee et al. | |
| 10,515,990 B2 | 12/2019 | Hung et al. | |
| 10,559,661 B2 | 2/2020 | Tsai et al. | |
| 10,756,183 B2 | 8/2020 | Then et al. | |
| 2008/0272417 A1* | 11/2008 | Yeo .................. | H01L 27/14603 257/292 |
| 2009/0008686 A1* | 1/2009 | Maeda ............. | H01L 27/14603 257/292 |
| 2019/0386047 A1 | 12/2019 | Sawada et al. | |

FOREIGN PATENT DOCUMENTS

| | | |
|---|---|---|
| KR | 10-1169464 | 7/2012 |
| KR | 10-1388655 | 4/2014 |

* cited by examiner

*Primary Examiner* — Douglas W Owens
(74) *Attorney, Agent, or Firm* — F. CHAU & ASSOCIATES, LLC

(57) ABSTRACT

An image sensor includes: a first device isolation part in a substrate and defining an active region; a first gate electrode having a first and second gate sidewalls; and a first impurity region and a second impurity region adjacent to the first and second gate sidewalls, wherein the active region includes: a first active central part; a first active protrusion; and a second active protrusion, wherein the first device isolation part has a first isolation sidewall overlapping the first active central part, and wherein a first straight line is at least partially spaced apart from the first isolation sidewall, wherein the first straight line links a first point, at which the first active protrusion meets the first active central part, to a second point, at which the second active protrusion meets the first active central part.

20 Claims, 25 Drawing Sheets

IMAGE SENSOR AND SEMICONDUCTOR DEVICE INCLUDING ASYMMETRIC ACTIVE REGION

CROSS-REFERENCE TO RELATED APPLICATION

This U.S. nonprovisional application claims priority under 35 U.S.C. § 119 to Korean Patent Application No. 10-2020-0187337 filed on Dec. 30, 2020, in the Korean Intellectual Property Office, the disclosure of which is incorporated by reference herein in its entirety.

TECHNICAL FIELD

The present inventive concept relates to an image sensor, and more particularly, to image sensors and semiconductor devices including asymmetric active regions.

DISCUSSION OF THE RELATED ART

Generally, an image sensor is a semiconductor device that transforms optical images into electrical signals. The image sensor may be classified as either a charge coupled device (CCD) type or a complementary metal oxide semiconductor (CMOS) type. The CIS (CMOS image sensor) is an acronym for the CMOS type image sensor. The CIS typically includes a plurality of two-dimensionally arranged pixels. Each of the pixels includes a photodiode (PD). Generally, the photodiode is configured to transform an incident light into an electrical signal.

SUMMARY

According to an exemplary embodiment of the present inventive concept, an image sensor includes: a first device isolation part in a substrate and defining a structured active region; a first gate electrode that extends in a first direction across the active region and has a first gate sidewall and a second gate sidewall that are spaced apart from each other in a second direction orthogonal to the first direction; and a first impurity region and a second impurity region disposed in the active region and respectively disposed at the first gate sidewall and the second gate sidewall, wherein the active region includes: a first active central part that overlaps the first gate electrode; a first active protrusion in which the first impurity region is disposed; and a second active protrusion in which the second impurity region is disposed, wherein the first device isolation part has a first isolation sidewall overlapping the first active central part, wherein the first isolation sidewall extends parallel to the second direction, and wherein a first straight line is at least partially spaced apart from the first isolation sidewall, wherein the first straight line links a first point to a second point, wherein the first point is where the first active protrusion meets the first active central part and is adjacent to the first isolation sidewall, and the second point is where the second active protrusion meets the first active central part and is adjacent to the first isolation sidewall.

According to an exemplary embodiment of the present inventive concept, an image sensor includes: a pixel separation part in a substrate and separating a first unit pixel and a second unit pixel from each other; a first device isolation part in the first unit pixel and defining a structured first active region; a first gate electrode that extends in a first direction across the first active region and has a first gate sidewall and a second gate sidewall that are spaced apart from each other in a second direction orthogonal to the first direction; and a first impurity region and a second impurity region in the first active region and respectively disposed at the first gate sidewall and the second gate sidewall, wherein the first active region includes: a first active central part that overlaps the first gate electrode; a first active protrusion in which the first impurity region is disposed; and a second active protrusion in which the second impurity region is disposed, wherein the first device isolation part has a first isolation sidewall overlapping the first active central part, wherein the first isolation sidewall extends parallel to the second direction, and wherein a first straight line is at least partially spaced apart from the first isolation sidewall, wherein the first straight line links a first point to a second point, wherein the first point is where the first active protrusion meets the first active central part and is adjacent to the first isolation sidewall, and the second point is where the second active protrusion meets the first active central part and is adjacent to the first isolation sidewall.

According to an exemplary embodiment of the present inventive concept, a semiconductor device includes: a device isolation part in a substrate and defining an active region; a first gate electrode that extends in a first direction across the active region and has a first gate sidewall and a second gate sidewall that are spaced apart from each other in a second direction intersecting the first direction; and a first impurity region and a second impurity region disposed in the active region and respectively adjacent to the first gate sidewall and the second gate sidewall, wherein the device isolation part has a first isolation sidewall that overlaps the first gate electrode, wherein the first isolation sidewall is parallel to the second direction, wherein the first impurity region has a first corner point that is adjacent to the first isolation sidewall, wherein the first corner point is where the first impurity region meets the first gate sidewall, wherein the second impurity region has a second corner point that is adjacent to the first isolation sidewall, wherein the second corner point is where the second impurity region meets the second gate sidewall, and wherein a first straight line is at least partially spaced apart from the first isolation sidewall, wherein the first straight line links the first corner point to the second corner point.

DETAILED DESCRIPTION OF THE EMBODIMENTS

Figure 1A:
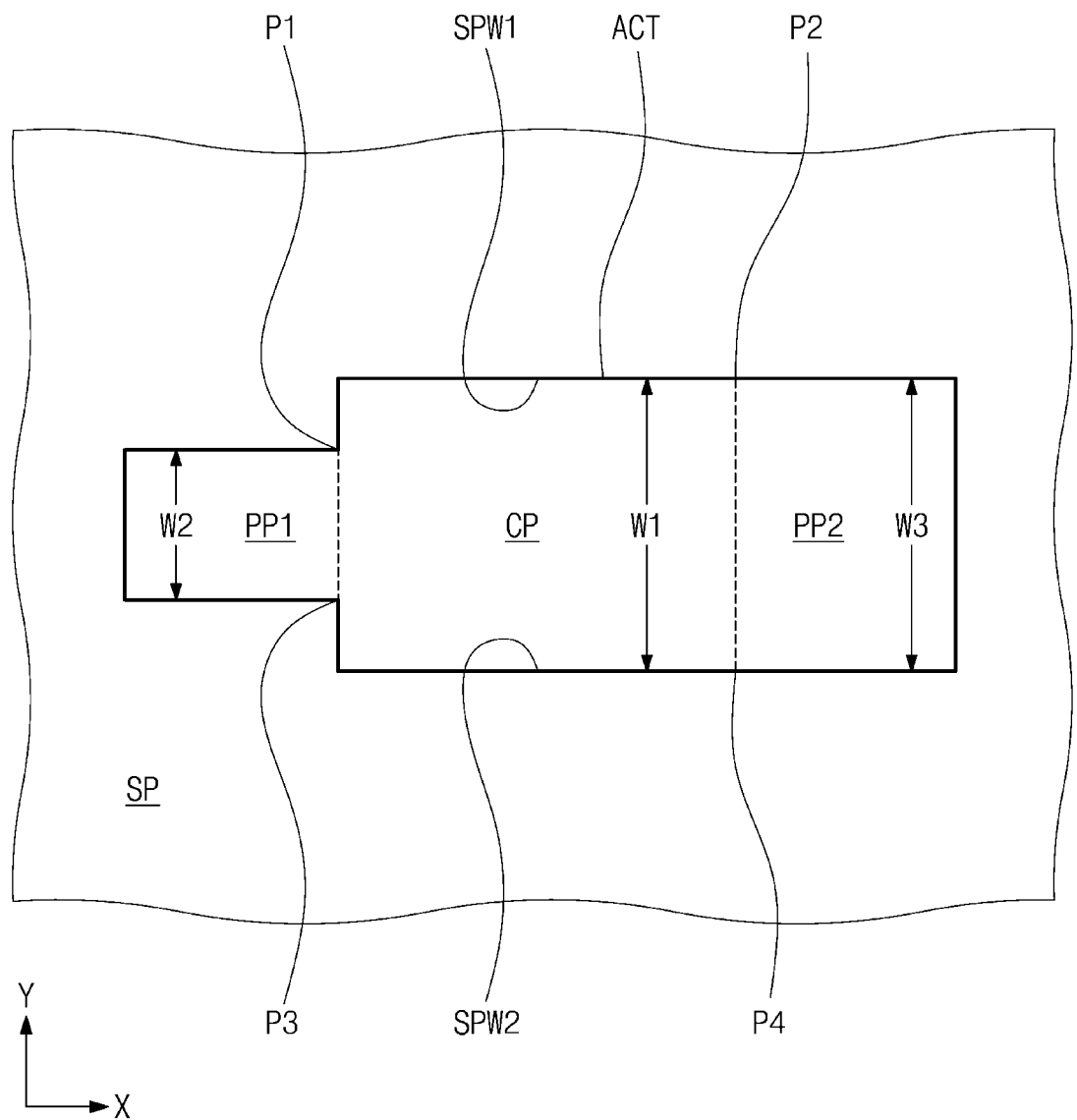
FIG. 1A illustrates a plan view showing an active region of a semiconductor device according to an exemplary embodiment of the present inventive concept.

Exemplary embodiments of the present inventive concept will be described more fully hereinafter with reference to the accompanying drawings. In the figures, like reference numerals may denote like elements or features, and thus their descriptions may be omitted.

Figure 1B:
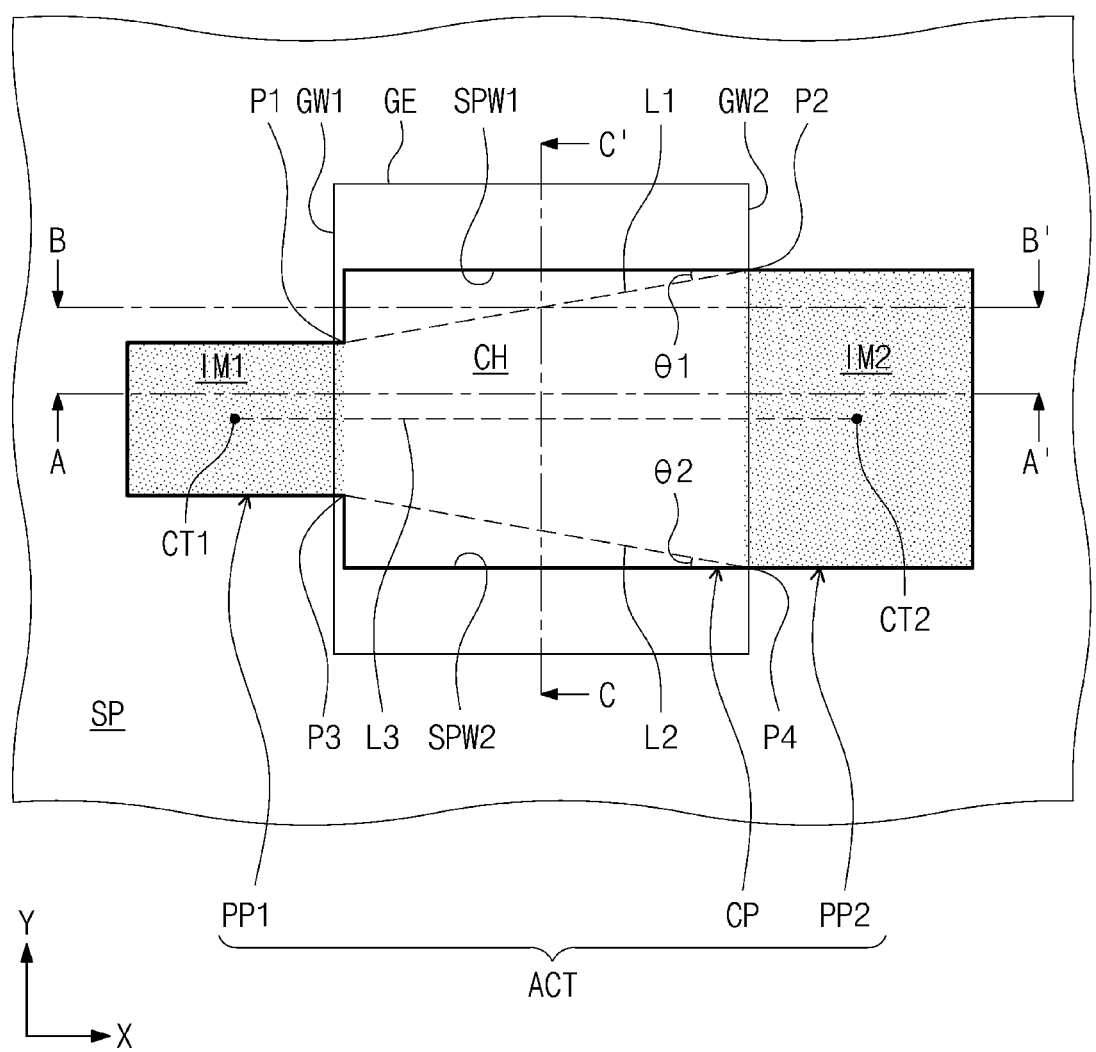
FIG. 1B illustrates a plan view showing a semiconductor device according to an exemplary embodiment of the present inventive concept.
Figure 1C:
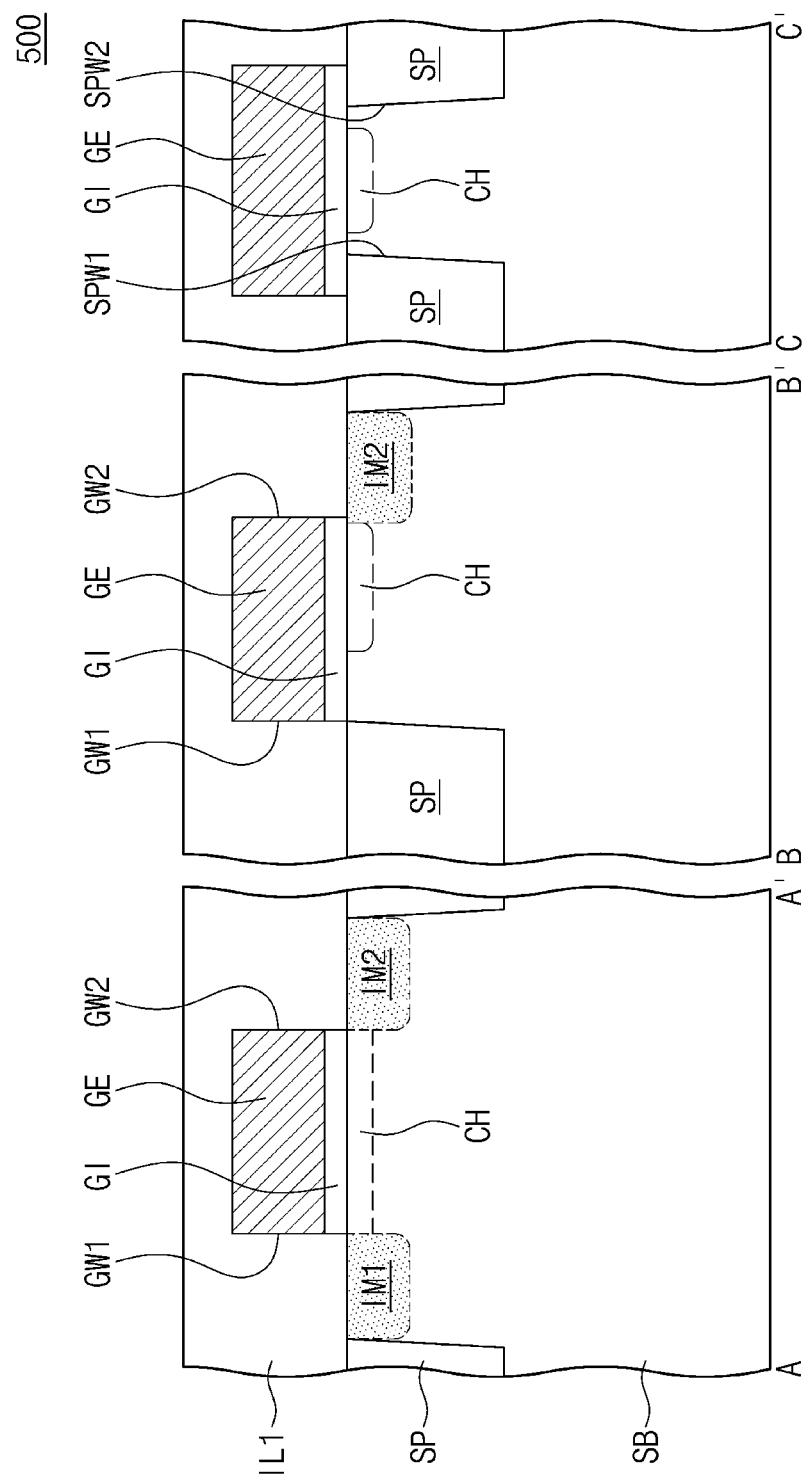
FIG. 1C illustrates a cross-sectional view taken along lines A-A', B-B', and C-C' of FIG. 1B.
Figure 1D:
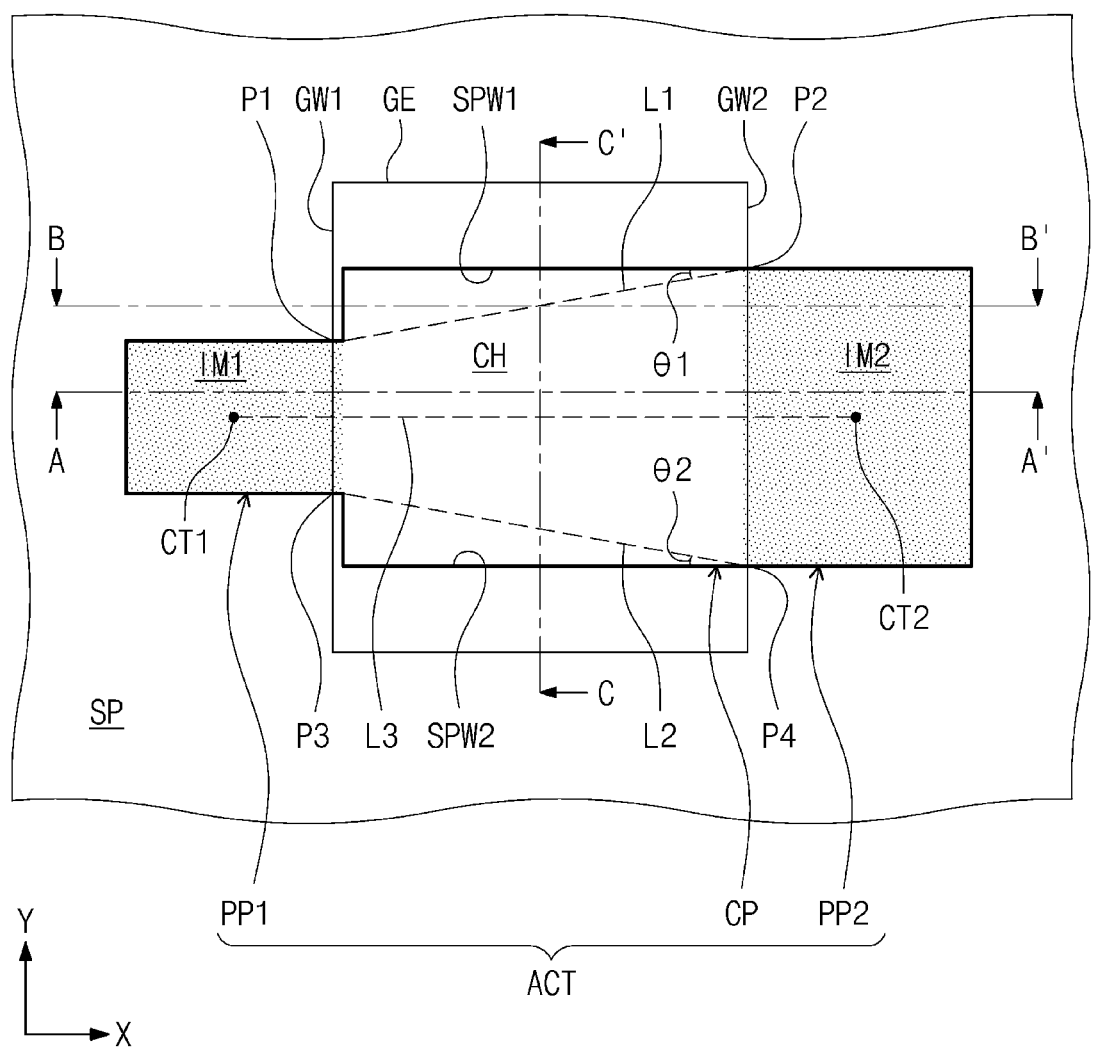
FIG. 1D illustrates a plan view showing a semiconductor device according to an exemplary embodiment of the present inventive concept.

FIG. 1A illustrates a plan view showing an active region of a semiconductor device according to an exemplary embodiment of the present inventive concept. FIG. 1B illustrates a plan vies showing a semiconductor device having the active region of FIG. 1A. FIG. 1C illustrates a cross-sectional view taken along lines A-A', B-B', and C-C' of FIG. 1B. FIG. 1D illustrates a plan view showing a semiconductor device according to an exemplary embodiment of the present inventive concept.

Referring to FIGS. 1A to 1C, a semiconductor device 500 according to the present embodiment may be configured such that a substrate SB may be provided with a device isolation part SP to provide an active region ACT. The semiconductor device 500 may correspond to a peripheral region, a core region, or a portion (e.g., transistor positioned thereon) of a logic region of a memory device. The semiconductor device 500 may correspond to a portion of an image sensor (e.g., to at least one of reset, source follower, and selection transistors that are positioned on the portion of an image sensor). The substrate SB may be a semiconductor substrate including a semiconductor material, such as silicon. For example, the substrate SB may be a single-crystalline silicon substrate, a silicon epitaxial layer substrate, or a silicon-on-insulator (SOI) substrate. The substrate 100 may be, for example, doped with impurities having a first conductivity type. The device isolation part SP may include one or more of a device isolation layer and a device isolation area. The device isolation layer may be formed by, for example, a shallow trench isolation (STI) process. The device isolation layer may include, for example, at least one of a silicon oxide layer, a silicon nitride layer, and a silicon oxynitride layer. The device isolation area may be, for example, an area to which impurities of the first conductivity type are doped, and the impurities doped in the device isolation layer may have a concentration greater than that of impurities doped in the substrate SB.

Referring to FIG. 1A, the active region ACT may have an asymmetric shape in a first direction X. The active region ACT may not have a rectangular shape. The active region ACT may include an active central part CP, a first active protrusion PP1 disposed on one side of the active central part CP, and a second active protrusion PP2 disposed on another side of the active central part CP. The device isolation part SP may have a first isolation sidewall SPW1 and a second isolation sidewall SPW2 that are in contact with the active central part CP and are parallel to the first direction X. In the present embodiment, the first isolation sidewall SPW1 and the second isolation sidewall SPW2 may extend toward the second active protrusion PP2. The first isolation sidewall SPW1 and the second isolation sidewall SPW2 may not extend toward the first active protrusion PP1. The active central part CP may have a first width W1 in a second direction Y orthogonal to the first direction X. The first active protrusion PP1 may have a second width W2 in the second direction Y. The second active protrusion PP2 may have a third width W3 in the second direction Y. In the present embodiment, the second width W2 may be less than the first width W1 and may be less than the third width W3. For example, the first width W1 may be substantially equal to the third width W3. However, the present inventive concept is not limited thereto. For example, the third width W3 may be different from the first width W1.

As shown in FIGS. 1A and 1B, the active region ACT may have a first point P1 that is in contact with first active protrusion PP1 and the active central part CP and is most adjacent to the first isolation sidewall SPW1. The active region ACT may have a second point P2 that is in contact with the second active protrusion PP2 and the active central part CP and is most adjacent to the first isolation sidewall SPW1. The active region ACT may have a third point P3 that is in contact with the first active protrusion PP1 and the active central part CP and is most adjacent to the second isolation sidewall SPW2. The active region ACT may have a fourth point P4 that is in contact with the second active protrusion PP2 and the active central part CP and is most adjacent to the second isolation sidewall SPW2. In the present embodiment, the first point P1 may be spaced apart from the first isolation sidewall SPW1, and the second point P2 may be positioned on the first isolation sidewall SPW1. The third point P3 may be spaced apart from the second isolation sidewall SPW2, and the fourth point P4 may be positioned on the second isolation sidewall SPW2.

A gate electrode GE may be disposed on the substrate SB. The gate electrode GE and the substrate SB may be covered with a first interlayer dielectric layer IL1. The gate electrode GE may include, for example, at least one of an impurity-doped polysilicon layer, a metal layer such as a tungsten layer, and a metal nitride layer such as a titanium nitride layer. The first interlayer dielectric layer IL1 may have a single-layered or multi-layered structure formed of at least one of a silicon oxide layer, a silicon nitride layer, a silicon oxynitride layer, and a porous dielectric layer.

A gate dielectric layer GI may be interposed between the gate electrode GE and the substrate SB. The gate dielectric layer GI may include at least one of a silicon oxide layer, a silicon oxynitride layer, a silicon nitride layer, and a metal oxide layer. The metal oxide layer may include, for example, at least one of an aluminum oxide layer, a hafnium oxide layer, a zirconium oxide layer, and a ruthenium oxide layer. The gate electrode GE may have a first gate sidewall GW1 and a second gate sidewall GW2 that are opposite to each other.

The gate electrode GE may extend in the second direction Y across the active region ACT. The gate electrode GE may overlap the active central part CP. The first active protrusion PP1 may be exposed outside the first gate sidewall GW1. The second active protrusion PP2 may be exposed outside the second gate sidewall GW2. For example, the first and second active protrusions PP1 and PP2 might not be overlapped by gate electrode GE. A first impurity region IM1 may be disposed in the first active protrusion PP1. A second impurity region IM2 may be disposed in the second active protrusion PP2. The first and second impurity regions IM1 and IM2 may be doped with impurities having a second conductivity type opposite to the first conductivity type.

In FIG. 1B, a first straight line L1 may link the first point P1 to the second point P2, and may be at least partially spaced apart from the first isolation sidewall SPW1. A second straight line L2 may link the third point P3 to the fourth point P4, and may be at least partially spaced apart from the second isolation sidewall SPW2. The first straight line L1 may make a first angle θ1 relative to the first isolation sidewall SPW1. The second straight line L2 may make a second angle θ2 relative to the second isolation sidewall SPW2. In the present embodiment, each of the first and second angles θ1 and θ2 may be an acute angle greater than 0° and less than about 90°.

The first active protrusion PP1 may have a portion that extends below the gate electrode GE. For example, the first and third points P1 and P2 may overlap the gate electrode GE. In addition, each of the first and second impurity regions IM1 and IM2 may have a portion that extends below the gate electrode GE.

In addition, when viewed in plan as shown in FIG. 1D, the first point P1 may be a corner at which the first impurity region IM1 meets the first gate sidewall GW1 and which is most adjacent to the first isolation sidewall SPW1. Likewise, when viewed in plan, the second point P2 may be a corner at which the second impurity region IM2 meets the second gate sidewall GW2 and which is most adjacent to the first isolation sidewall SPW1. When viewed in plan, the third point P3 may be a corner at which the first impurity region IM1 meets the first gate sidewall GW1 and which is most adjacent to the second isolation sidewall SPW2. When viewed in plan, the fourth point P4 may be a corner at which the second impurity region IM2 meets the second gate sidewall GW2 and which is most adjacent to the second isolation sidewall SPW2.

When viewed in plan as shown in FIG. 1B, the first impurity region IM1 may have a first center CT1. The first center CT1 may be coincident with a center of the first active protrusion PP1. The second impurity region IM2 may have a second center CT2. The second center CT2 may be coincident with a center of the second active protrusion PP2. A third straight line L3 may link the first center CT1 to the second center CT2 and may be parallel to the first direction X. One of the first and second impurity regions IM1 and IM2 may be a source region, and the other of the first and second impurity regions IM1 and IM2 may be a drain region. A transistor may be constituted by the gate electrode GE, the gate dielectric layer GI, the first impurity region IM1, and the second impurity region IM2. A contact plug may be disposed on each of the first and second impurity regions IM1 and IM2. The semiconductor device 500 may be a transistor of which source and drain regions are asymmetric to each other.

When a voltage is applied to one of the first and second impurity regions IM1 and IM2, and when a voltage is applied to the gate electrode GE, electrons/holes may migrate toward the first impurity region IM1 or the second impurity region IM2, which may create a channel region CH. In this case, the channel region CH may (on the whole) be formed on the active central part CP and between the first straight line L1 and the second straight line L2. For example, the electrons/holes flowing through the channel region CH may contact (almost) neither the first isolation sidewall SPW1 nor the second isolation sidewall SPW2.

When the device isolation part SP is formed as a device isolation layer, dangling bonds may be present on a surface of the device isolation layer or a surface of the substrate SB in contact with the device isolation layer. When the channel region CH is in contact with one or both of the first and second isolation sidewalls SPW1 and SPW2, the dangling bonds may trap the electrons/holes that flow through the channel region CH and/or the trapped electrons/holes may escape belatedly and then migrate. This may cause noise of electrical signals occurring from the transistor. When the semiconductor device 500 is an image sensor, such problems may induce random telegraph signal (RTS) noise, dark current, and/or white spot.

In contrast, according to the present inventive concept, the electrons/holes flowing through the channel region CH may be in contact with neither the first isolation sidewall SPW1 nor the second isolation sidewall SPW2, which may prevent noise from being generated. Accordingly, the semiconductor device 500 may increase in reliability, and the image sensor may accomplish clear images. The transistor discussed with reference to FIGS. 1A to 1C may correspond to, for example, at least one of reset transistors, source follower transistors, and selection transistors included in the image sensor. The gate electrode GE may correspond to a gate electrode of at least one of reset transistors, source follower transistors, and selection transistors included in the image sensor.

A transistor of the semiconductor device 500 disclosed in FIGS. 1A to 1C may have an effective gate width that corresponds to (W2+W3)/2. The transistor may have a reduction in noise due to an increase in amount of current, compared to a transistor disposed on an active region as a whole shaped like a rectangle that has a second width W2 in the second direction Y.

Figure 2A:
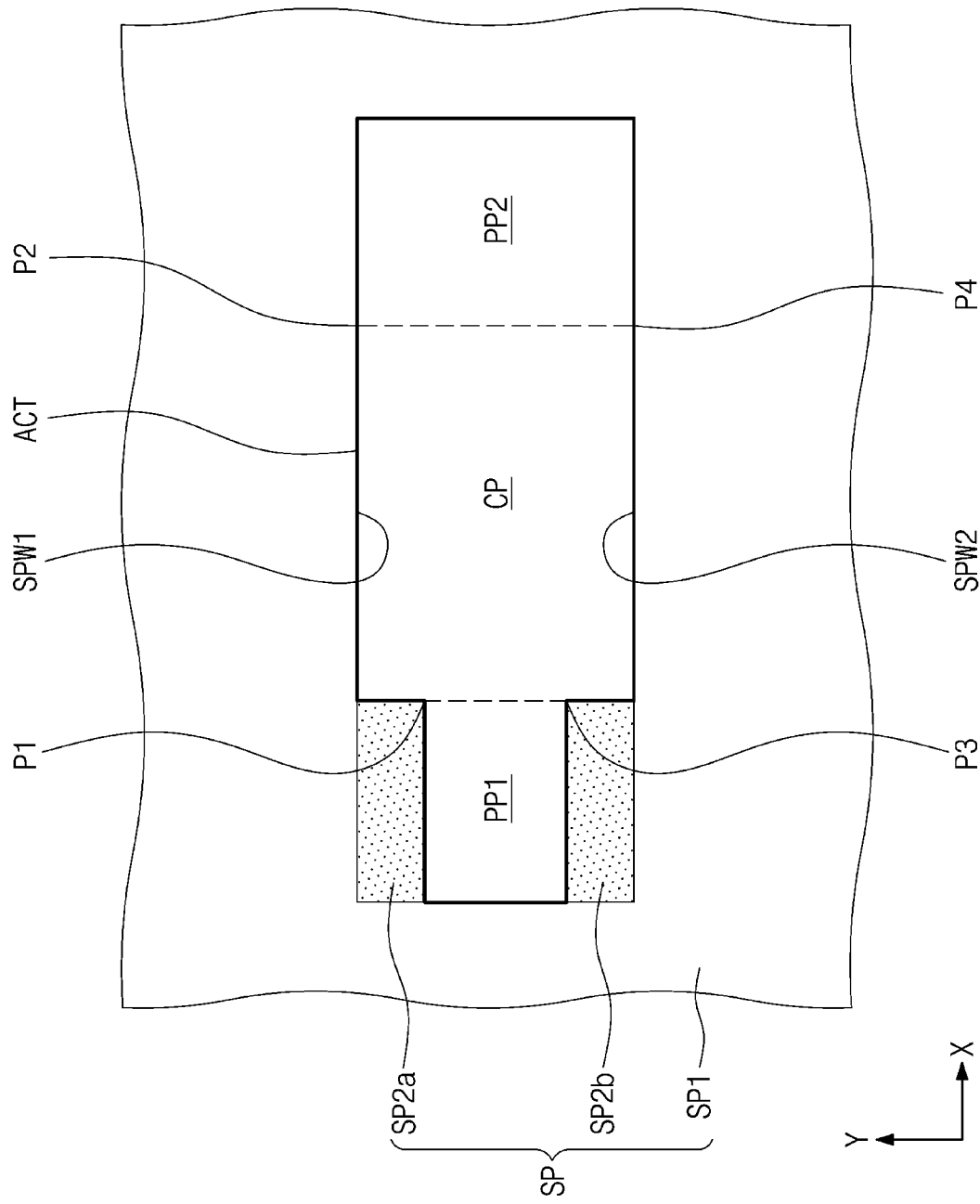
FIG. 2A illustrates a plan view showing an active region of a semiconductor device according to an exemplary embodiment of the present inventive concept.
Figure 2B:
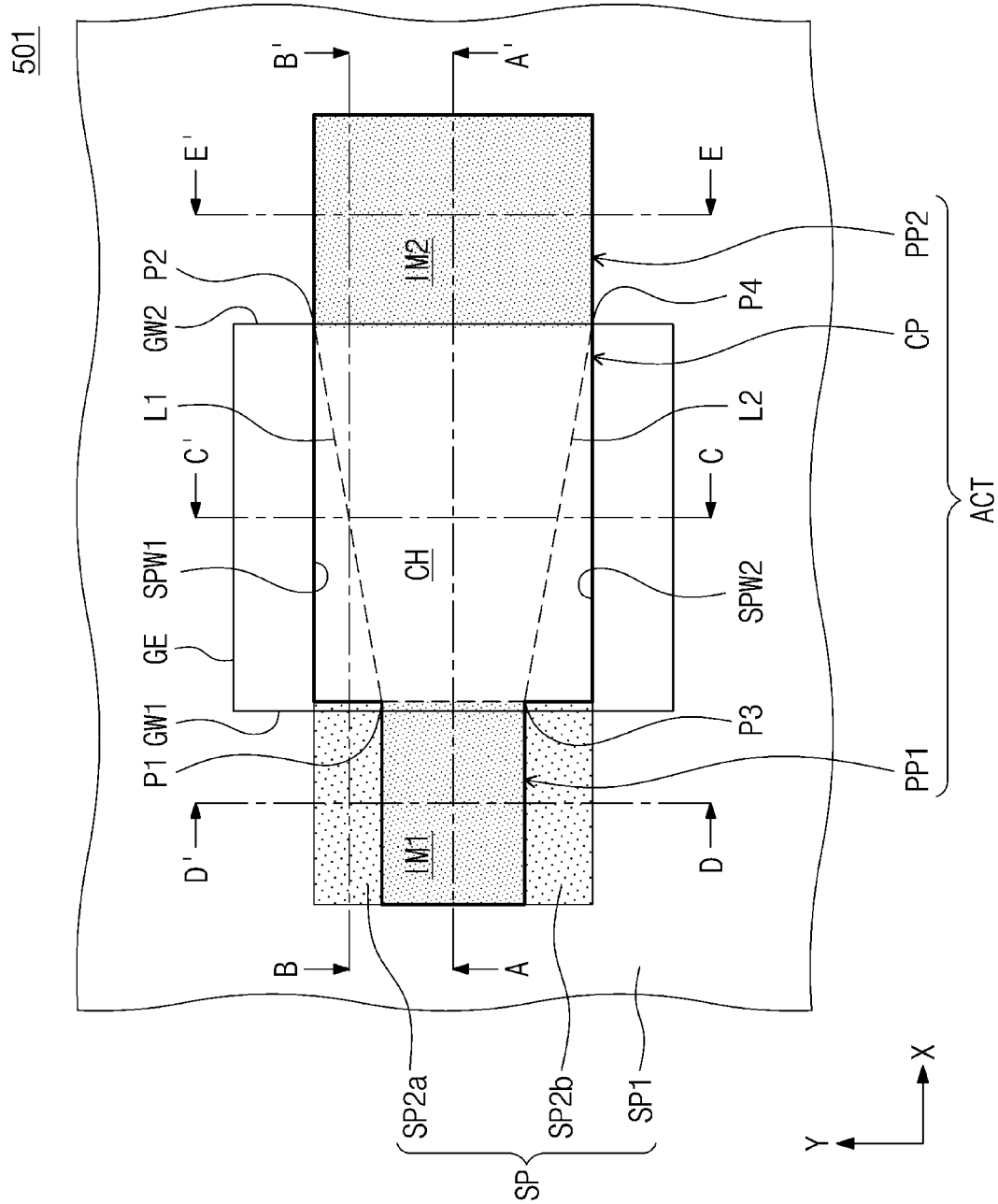
FIG. 2B illustrates a plan vies showing a semiconductor device having the active region of FIG. 2A.
Figure 2C:
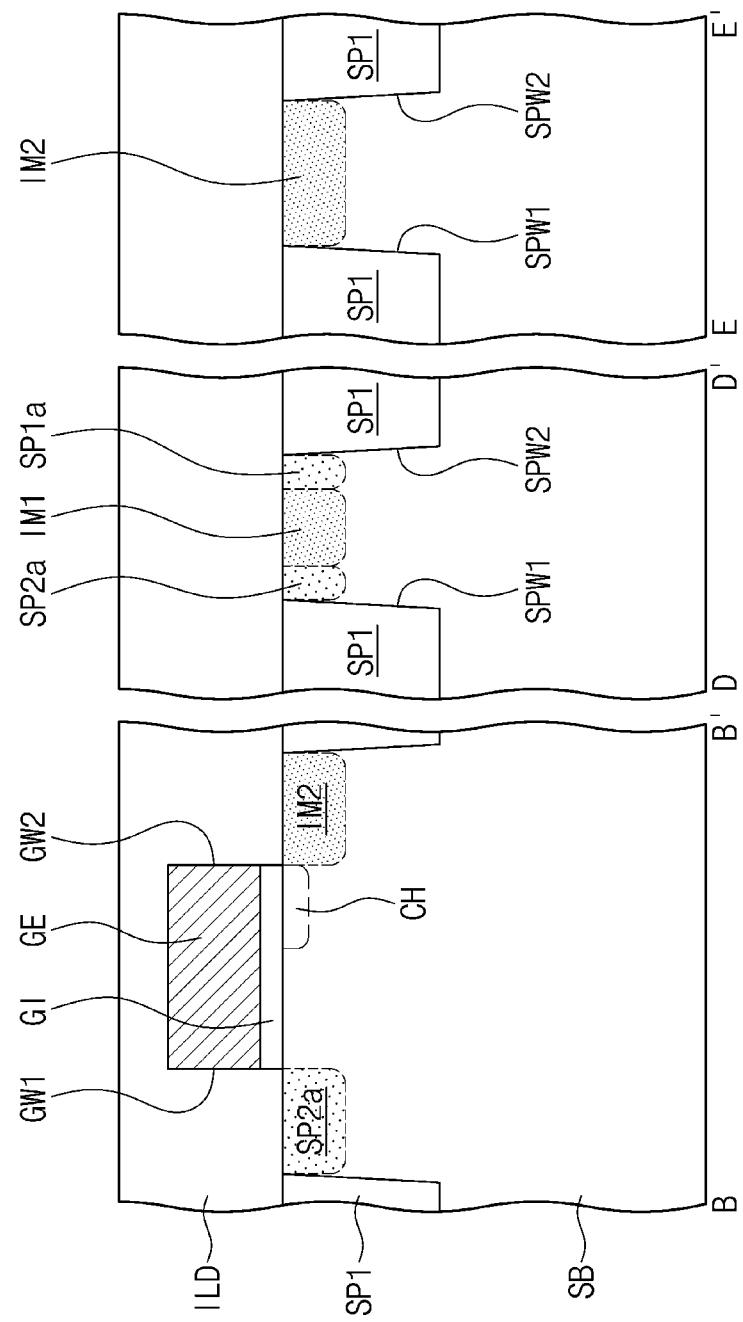
FIG. 2C illustrates a cross-sectional view taken along lines B-B', D-D', and E-E' of FIG. 2B.

FIG. 2A illustrates a plan view showing an active region of a semiconductor device according to an exemplary embodiment of the present inventive concept. FIG. 2B illustrates a plan view showing a semiconductor device having the active region of FIG. 2A. FIG. 2C illustrates a cross-sectional view taken along lines B-B', D-D', and E-E' of FIG. 2B. It is noted that cross-sectional views taken along lines A-A' and C-C' of FIG. 2B may be the same as the cross-sectional views taken along lines A-A' and C-C' of FIG. 1C, and thus, redundant descriptions may be omitted.

Referring to FIGS. 2A to 2C, a semiconductor device 501 according to the present embodiment may be configured such that the device isolation part SP may include a device isolation layer SP1, a first device isolation area SP2a, and a second device isolation area SP2b. The device isolation layer SP1 may be formed by a shallow trench isolation (STI) process and may have a single-layered or multi-layered structure formed of at least one of a silicon oxide layer, a silicon nitride layer, and a silicon oxynitride layer. The device isolation layer SP1 may define a rectangular preliminary active region. The first isolation sidewall SPW1 may correspond to one sidewall of the device isolation layer SP1, and may extend outside the gate electrode GE and the first and second gate sidewalls GW1 and GW2 of the gate electrode GE. For example, the first isolation sidewall SPW1 may extend beyond the first and second gate sidewalls GW1 and GW2. The second isolation sidewall SPW2 may correspond to another sidewall of the device isolation layer SP1, and may extend outside the gate electrode GE and the first and second gate sidewalls GW1 and GW2 of the gate electrode GE. The first device isolation area SP2a may be positioned outside the first gate sidewall GW1 and may be in contact with the first isolation sidewall SPW1. The second device isolation area SP2b may be positioned outside the second gate sidewall GW2 and may be in contact with the second isolation sidewall SPW2. For example, the second device isolation area SP2b may be positioned outside the first gate sidewall GW1 and may be in contact with the second isolation sidewall SPW2. The first and second isolation areas SP2a and SP2b may be spaced apart from each other in the second direction Y.

The substrate SB may have an active region ACT that is defined by the device isolation part SP that includes the device isolation layer SP1, the first device isolation area SP2a, and the second device isolation area SP2b. The active region ACT may have a planar shape the same as that of FIG. 1A. The active region ACT may have the active central part CP, the first active protrusion PP1, and the second active protrusions PP2. The active central part CP overlaps the gate electrode GE. The first active protrusion PP1 protrudes outwardly beyond the gate sidewall GW1, and the second active protrusion PP2 protrudes outwardly beyond the second gate sidewall GW2. The first and second device isolation areas SP2a and SP2b may have portions that extend below the gate electrode GE.

The first impurity region IM1 may be disposed in the first active protrusion PP1. The second impurity region IM2 may be disposed in the second active protrusion PP2. The first impurity region IM1 may be interposed between the first device isolation area SP2a and the second device isolation area SP2b. In addition, the first impurity region IM1 may be disposed between first and second isolation sidewalls SPW1 and SPW2. The second impurity region IM2 may be between the first and second isolation sidewalls SPW1 and SPW2. For example, the second impurity region IM2 may be in contact with both of the first and second isolation sidewalls SPW1 and SPW2. Other configurations may be identical or similar to those discussed with reference to FIGS. 1A to 1C.

Figure 3A:
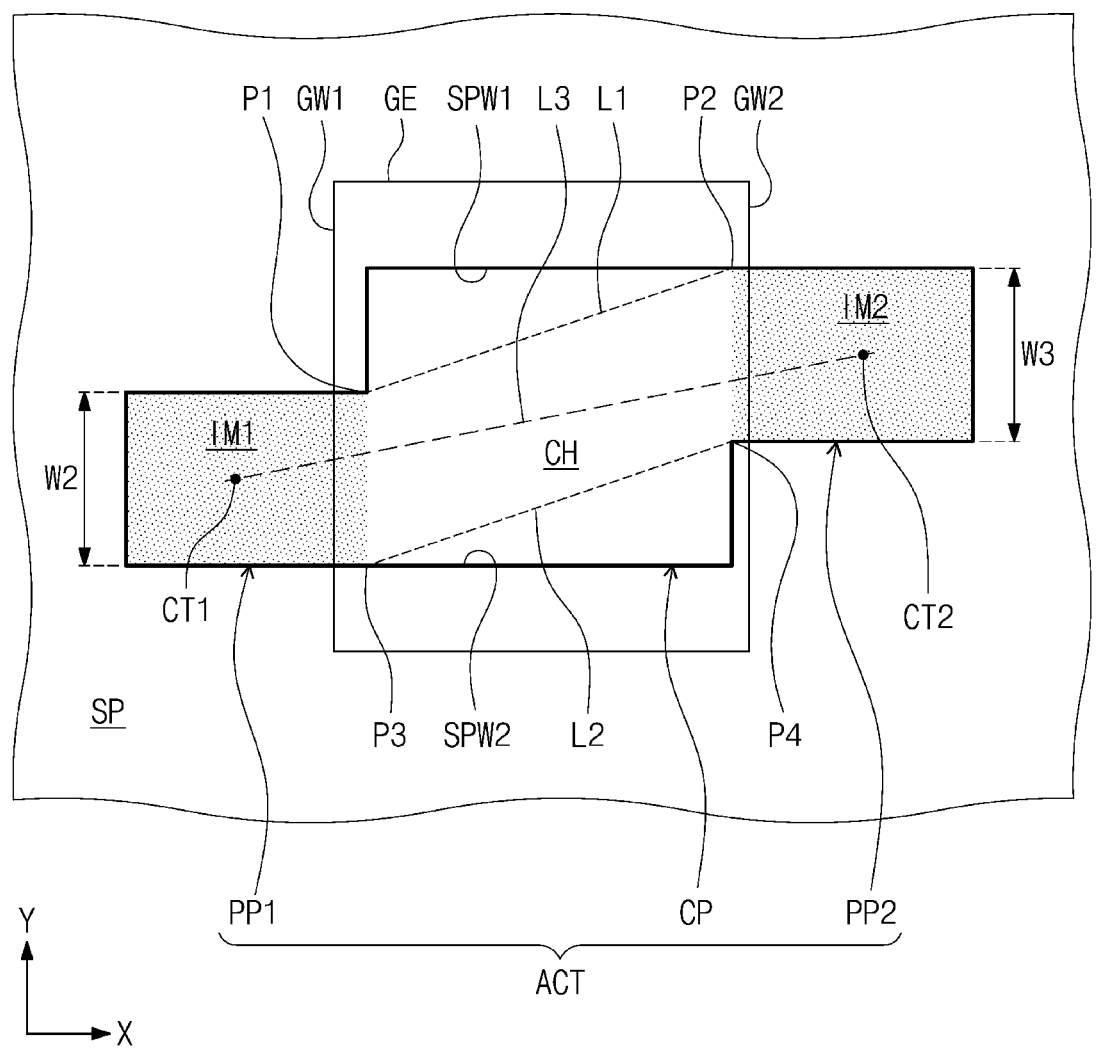
FIGS. 3A and 3B illustrate plan views showing a semiconductor device according to an exemplary embodiment of the present inventive concept.
Figure 3B:
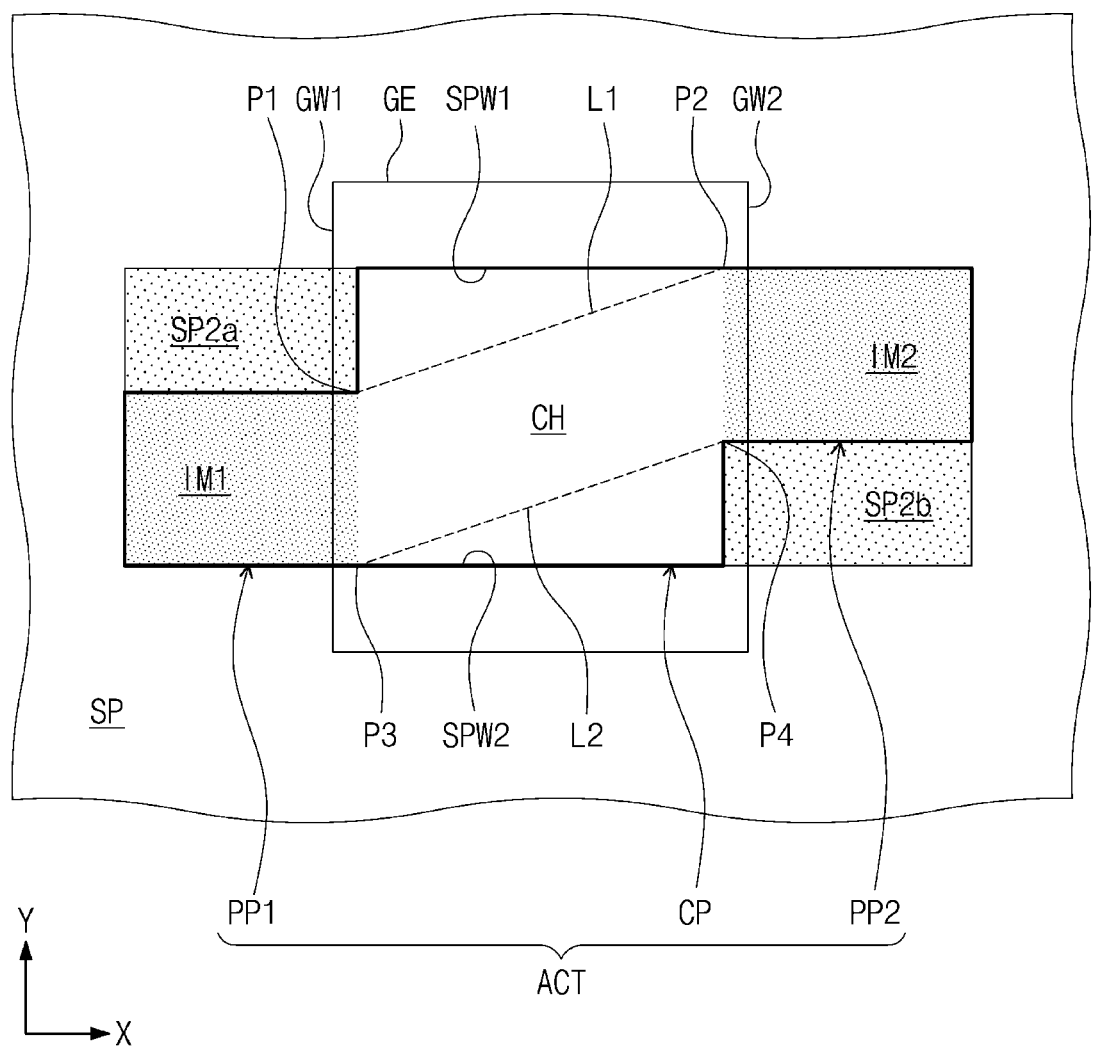

FIGS. 3A and 3B illustrate cross-sectional views showing a semiconductor device according to an exemplary embodiment of the present inventive concept.

Referring to FIG. 3A, a semiconductor device 502 according to the present embodiment may be configured such that the first isolation sidewall SPW1 may extend toward the second active protrusion PP2, but may not extend toward the first active protrusion PP1. In contrast, the second isolation sidewall SPW2 may extend toward the first active protrusion PP1, and may not extend toward the second active protrusion PP2. For example, the first and second active protrusions PP1 and PP2 may have substantially the same shape and the same size as each other. For example, the first active protrusion PP1 may have a second width W2 that is the same as a third width W3 of the second active protrusion PP2. The first point P1 may be spaced apart from the first isolation sidewall SPW1, and the second point P2 may be positioned on the first isolation sidewall SPW1. The third point P3 may be positioned on the second isolation sidewall SPW2, and the fourth point P4 may be spaced apart from the second isolation sidewall SPW2. The third straight line L3, which links the first center CT1 of the first impurity region IM1 to the second center CT2 of the second impurity region IM2, may not be parallel to the first direction X. The first and fourth points P1 and P4 may overlap the gate electrode GE. For example, the first and fourth points P1 and P4 may overlap a center of the gate electrode GE. Other configurations may be identical or similar to those discussed with reference to FIGS. 1A to 1C. A transistor of the semiconductor device 502 depicted in FIG. 3A may have off-current reduction due to an increase in channel length, compared to a transistor disposed on an active region as a whole shaped like a rectangle that has a second width W2 in the second direction Y.

Referring to FIG. 3B, a semiconductor device 503 according to the present embodiment may be configured such that the active region ACT may be defined by a device isolation layer SP1, a first device isolation area SP2a, and a second device isolation area SP2b. The device isolation layer SP1, the first device isolation area SP2a, and the second device isolation area SP2b may constitute the device isolation part SP of FIG. 3A. The active region ACT may have the same shape as that of the active region ACT depicted in FIG. 3A. Outside the first gate sidewall GW1, the first device isolation area SP2a may be interposed between the first isolation sidewall SPW1 and the first impurity region IM1. The first impurity region IM1 may be in contact with the second isolation sidewall SPW2. Outside the second gate sidewall GW2, the second device isolation area SP2b may be interposed between the second isolation sidewall SPW2 and the second impurity region IM2. The second impurity region IM2 may be in contact with the first isolation sidewall SPW1. Other configurations may be identical or similar to those discussed above with reference to FIG. 3A.

Figure 4A:
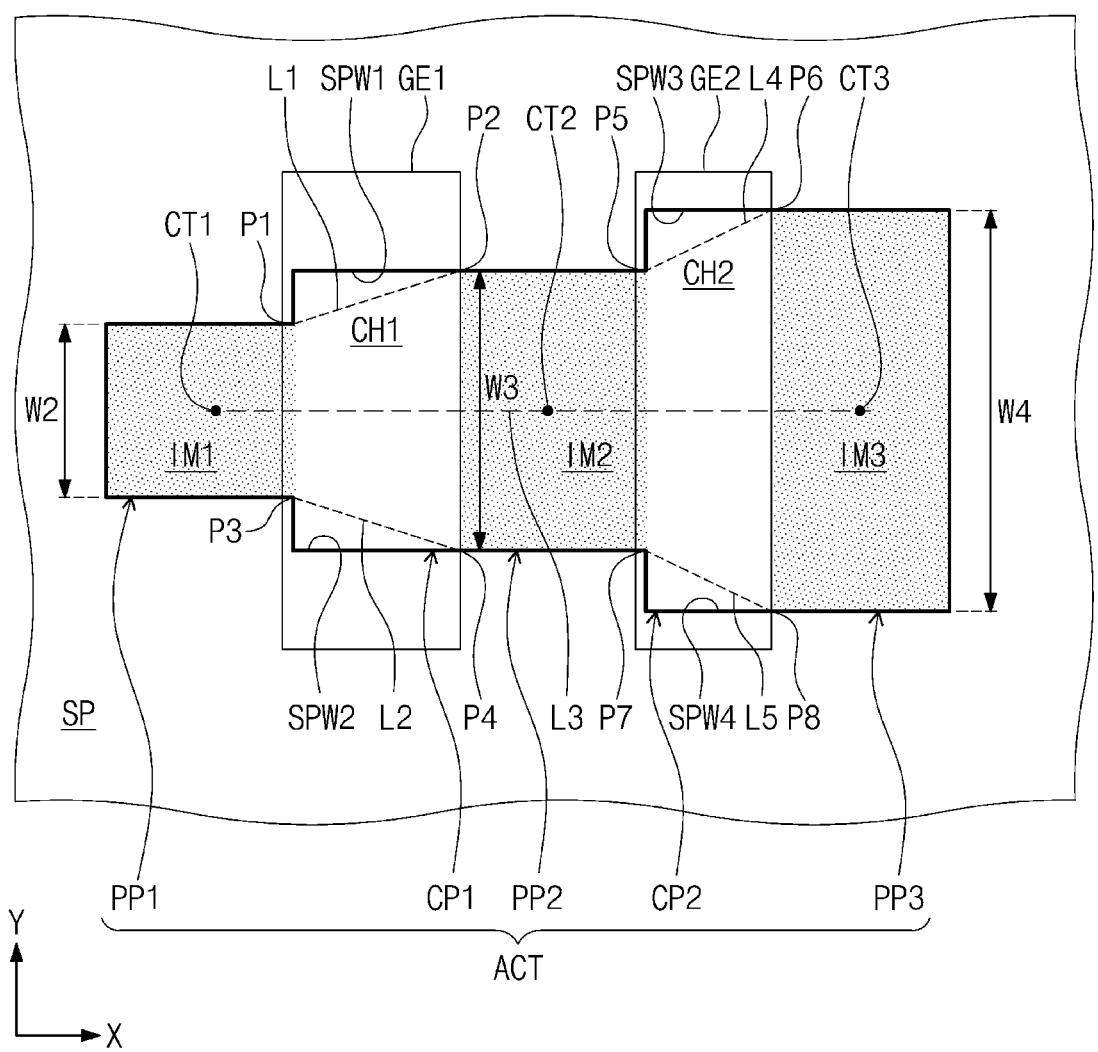
FIGS. 4A and 4B illustrate plan views showing a semiconductor device according to an exemplary embodiment of the present inventive concept.
Figure 4B:
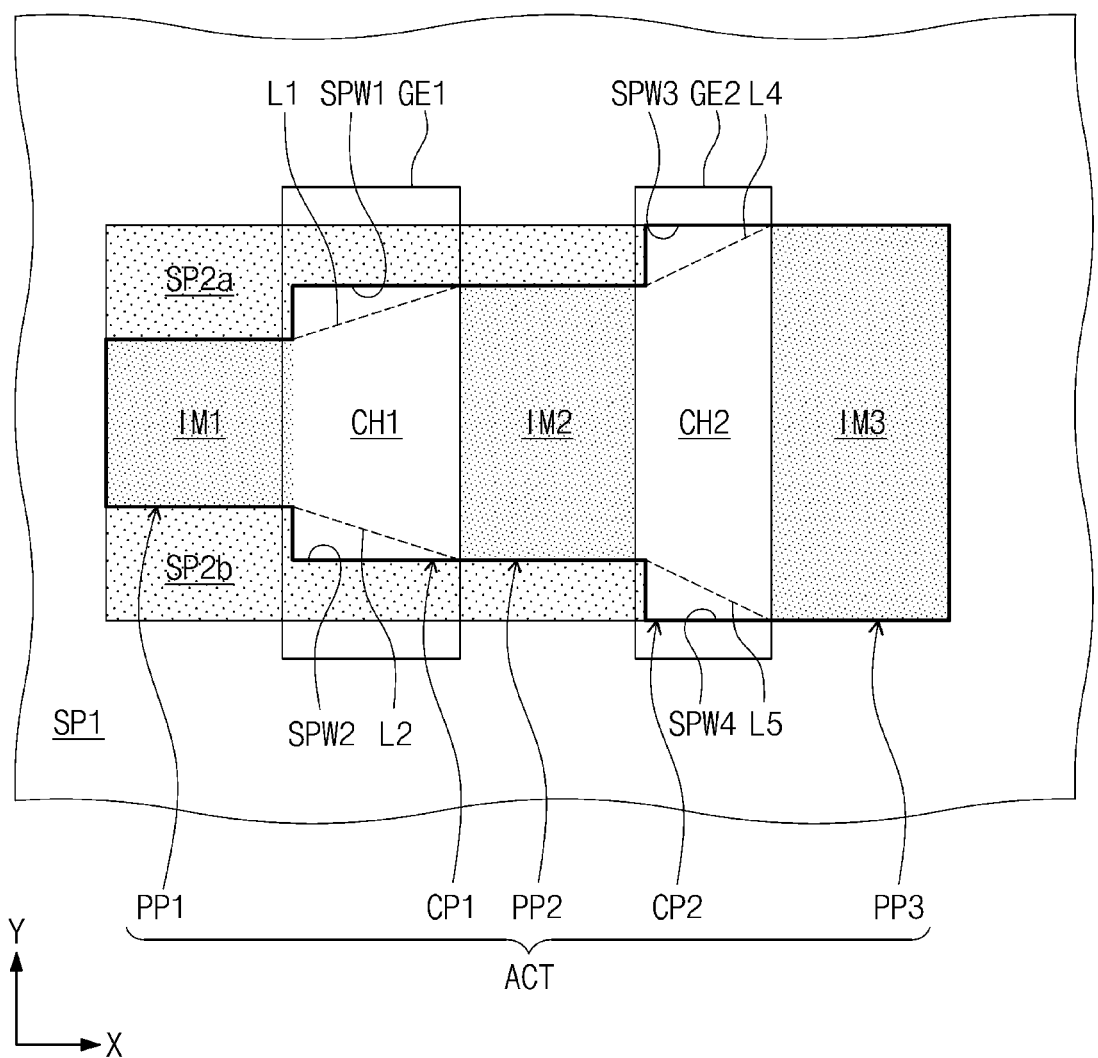

FIGS. 4A and 4B illustrate plan views showing a semiconductor device according to an exemplary embodiment of the present inventive concept.

Referring to FIG. 4A, a semiconductor device 504 according to the present embodiment may be configured such that a first gate electrode GE1 and a second gate electrode GE2 may be spaced apart from each other in the first direction X, and that the first and second gate electrodes GE1 and GE2 may extend in the second direction Y across the active region ACT. A gate dielectric layer (see GI of FIG. 1C) may be interposed between the first gate electrode GE1 and the substrate SB and between the second gate electrode GE2 and the substrate SB.

The active region ACT may have an asymmetric shape in the first direction X. The active region ACT may include a first active central part CP1 that overlaps the first gate electrode GE1, and may also include a second active central part CP2 that overlaps the second gate electrode GE2. The active region ACT may further include a first active protrusion PP1, a second active protrusion PP2, and a third active protrusion PP3. The first active protrusion PP1 may be outside one sidewall of the first active central part CP1. The second active protrusion PP2 may be between the first active central part CP1 and the second gate electrode GE2. The third active protrusion PP3 may be outside one sidewall of the second gate electrode GE2. The first active protrusion PP1 may have a second width W2 in the second direction Y. The second active protrusion PP2 may have a third width W3 in the second direction Y. The third active protrusion PP3 may have a fourth width W4 in the second direction Y. In the present embodiment, the third width W3 may be greater than the second width W2 and less than the fourth width W4.

The device isolation part SP may have a first isolation sidewall SPW1 and a second isolation sidewall SPW2 that overlap the first gate electrode GE1 and are parallel to the first direction X. In addition, the device isolation part SP may have a third isolation sidewall SPW3 and a fourth isolation sidewall SPW4 that overlap the second gate electrode GE2 and are parallel to the first direction X. The first isolation sidewall SPW1 may not be aligned in the first direction X with the third isolation sidewall SPW3. The second isolation sidewall SPW2 may not be aligned in the first direction X with the fourth isolation sidewall SPW4. For example, the first isolation sidewall SPW1 may extend to the third isolation sidewall SPW3, and the second isolation sidewall SPW2 may extend to the fourth isolation sidewall SPW4.

The first active central part CP1 may have a first point P1 and a third point P3 that are in contact with the first active protrusion PP1. The first active central part CP1 may have a second point P2 and a fourth point P4 that are in contact with the second active protrusion PP2. The second active central part CP2 may have a fifth point P5 and a seventh point P7 that are in contact with the second active protrusion PP2. The second active central part CP2 may have a sixth point P6 and an eighth point P8 that are in contact with the third active protrusion PP3.

A first straight line L1 may link the first point P1 to the third point P3, and may be at least partially spaced apart from the first isolation sidewall SPW1. A second straight line L2 may link the second point P2 to the fourth point P4, and may be at least partially spaced apart from the second isolation sidewall SPW2.

A first impurity region IM1 may be disposed in the first active protrusion PP1. A second impurity region IM2 may be disposed in the second active protrusion PP2. A third impurity region IM3 may be disposed in the third active protrusion PP3. The first, second, and third impurity regions IM1, IM2, and IM3 may respectively include first, second, and third centers CT1, CT2, and CT3, and a third straight line L3 that links the first, second, and third centers CT1, CT2, and CT3 to each other may be parallel to the first direction X and extend through the first, second, and third impurity regions IM1, IM2, and IM3.

A fourth straight line L4 may link the fifth point P5 to the sixth point P6, and may be at least partially spaced apart from the third isolation sidewall SPW3. A fifth straight line L5 may link the seventh point P7 to the eighth point P8, and may be at least partially spaced apart from the fourth isolation sidewall SPW4.

A first transistor may be constituted by the first impurity region IM1, the first gate electrode GE1, and the second impurity region IM2. A second transistor may be constituted by the second impurity region IM2, the second gate electrode GE2, and the third impurity region IM3.

When a voltage is applied to each of the first and second gate electrodes GE1 and GE2, a first channel region CH1 and a second channel CH2 may be created below the first gate electrode GE1 and the second gate electrode GE2, respectively. Each of the first and second channel regions CH1 and CH2 may contact none of the first to fourth isolation sidewalls SPW1 to SPW4 of the device isolation part SP. Therefore, signal noise may be prevented.

Referring to FIG. 4B, a semiconductor device 505 according to the present embodiment may be configured such that the active region ACT may be defined by a device isolation layer SP1, a first device isolation area SP2a, and a second device isolation area SP2b. The active region ACT may have the same shape as that of the active region ACT in FIG. 4A. In the present embodiment, the first isolation sidewall SPW1 may correspond to a sidewall of the first device isolation area SP2a. The second isolation sidewall SPW2 may correspond to a sidewall of the second device isolation area SP2b. The third isolation sidewall SPW3 and the fourth isolation sidewall SPW4 may correspond to sidewalls of the device isolation layer SP1. The first device isolation area SP2a may be interposed between the second impurity region IM2 and the third isolation sidewall SPW3 of the device isolation layer SP1, between the first active central part CP1 and the third isolation sidewall SPW3 of the device isolation layer SP1, and between the first impurity region IM1 and the third isolation sidewall SPW3 of the device isolation layer SP1. For example, the first isolation sidewall SPW1 may overlap the first device isolation area SP2a. The second device isolation area SP2b may be interposed between the second impurity region IM2 and the fourth isolation sidewall SPW4 of the device isolation layer SP1, between the first active central part CP1 and the fourth isolation sidewall SPW4 of the device isolation layer SP1, and between the first impurity region IM1 and the fourth isolation sidewall SPW4 of the device isolation layer SP1. For example, the second isolation sidewall SPW2 may overlap the second device isolation area SP2b. Other configurations may be identical or similar to those discussed above with reference to FIG. 4A.

Figure 5A:
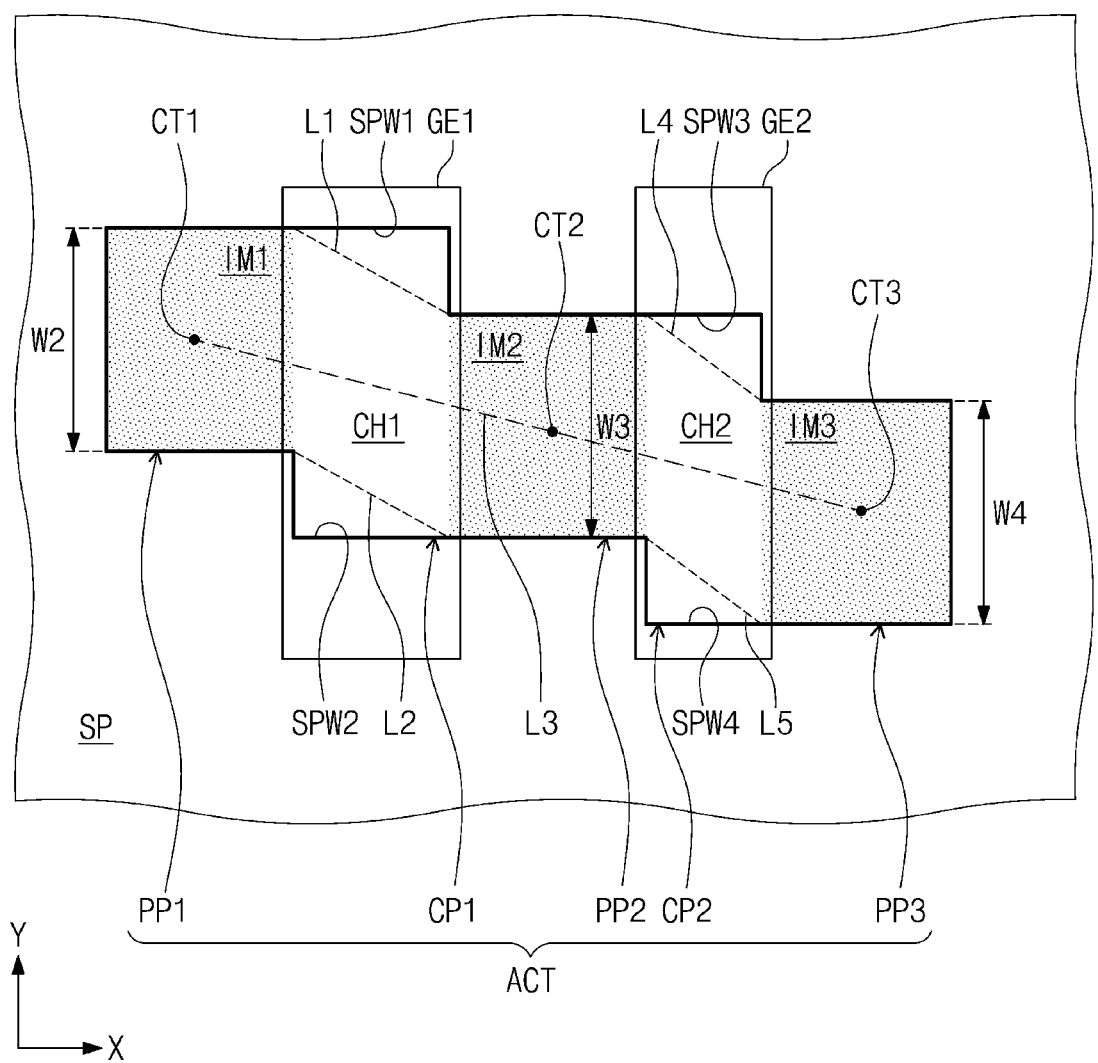
FIGS. 5A and 5B illustrate plan views showing a semiconductor device according to an exemplary embodiment of the present inventive concept.
Figure 5B:
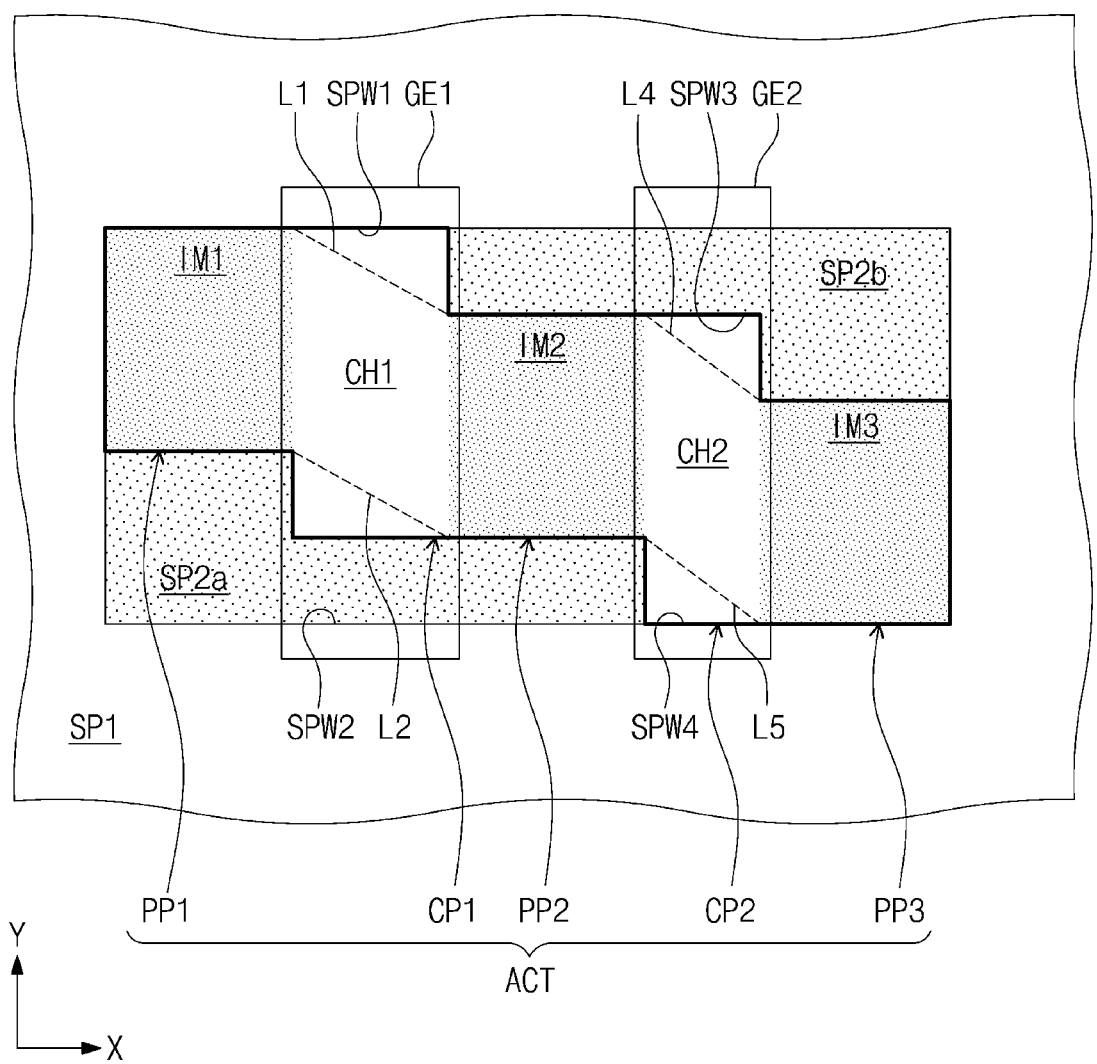

FIGS. 5A and 5B illustrate plan views showing a semiconductor device according to an exemplary embodiment of the present inventive concept.

Referring to FIG. 5A, a semiconductor device 506 according to the present embodiment may be configured such that the first, second, and third active protrusions PP1, PP2, and PP3 may have the same shape and the same size as each other. For example, the first, second, and third active protrusions PP1, PP2, and PP3 may respectively include first, second, and third widths W1, W2, and W3 that are the same as each other. The first, second, and third impurity regions IM1, IM2, and IM3 may respectively include first, second, and third centers CT1, CT2, and CT3, and a third straight line L3 that links the first, second, and third centers CT1, CT2, and CT3 to each other may not be parallel to the first direction X. Other configurations may be identical or similar to those discussed above with reference to FIG. 4A.

Referring to FIG. 5B, a semiconductor device 507 according to the present embodiment may be configured such that the active region ACT may be defined by a device isolation layer SP1, a first device isolation area SP2a, and a second device isolation area SP2b. The active region ACT may have the same shape as that of the active region ACT in FIG. 5A. In the present embodiment, the second isolation sidewall SPW2 may correspond to a sidewall of the first device isolation area SP2a. The third isolation sidewall SPW3 may correspond to a sidewall of the second device isolation area SP2b. The first isolation sidewall SPW1 and the fourth isolation sidewall SPW4 may correspond to sidewalls of the device isolation layer SP1. The first device isolation area SP2a may be interposed between the second impurity region IM2 and the fourth isolation sidewall SPW4 of the device isolation layer SP1, between the first active central part CP1 and the fourth isolation sidewall SPW4 of the device isolation layer SP1, and between the first impurity region IM1 and the fourth isolation sidewall SPW4 of the device isolation layer SP1. For example, the first device isolation area SP2*a* may overlap the first isolation sidewall SPW1, the second impurity region IM2, the third isolation sidewall SPW3, and the third impurity region IM3. The second device isolation area SP2*b* may be interposed between the second impurity region IM2 and the first isolation sidewall SPW1 of the device isolation layer SP1, between the second active central part CP2 and the first isolation sidewall SPW1 of the device isolation layer SP1, and between the third impurity region IM3 and the first isolation sidewall SPW1 of the device isolation layer SP1. For example, the second device isolation area SP2*b* may overlap the fourth isolation sidewall SPW4, the second impurity region IM2, the second isolation sidewall SPW2, and the first impurity region IM1. Other configurations may be identical or similar to those discussed above with reference to FIG. 5A.

Figure 6A:
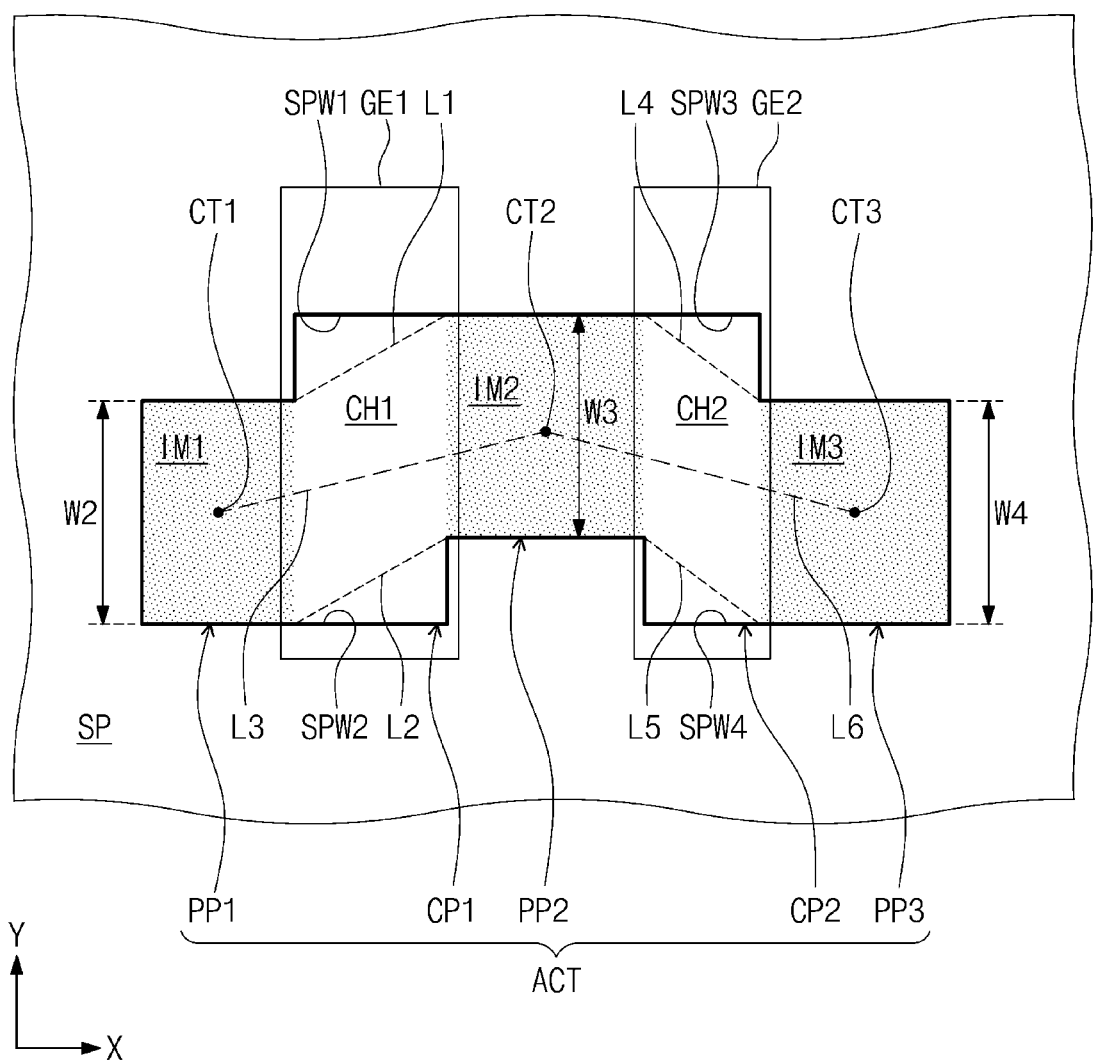
FIGS. 6A and 6B illustrate plan views showing a semiconductor device according to an exemplary embodiment of the present inventive concept.
Figure 6B:
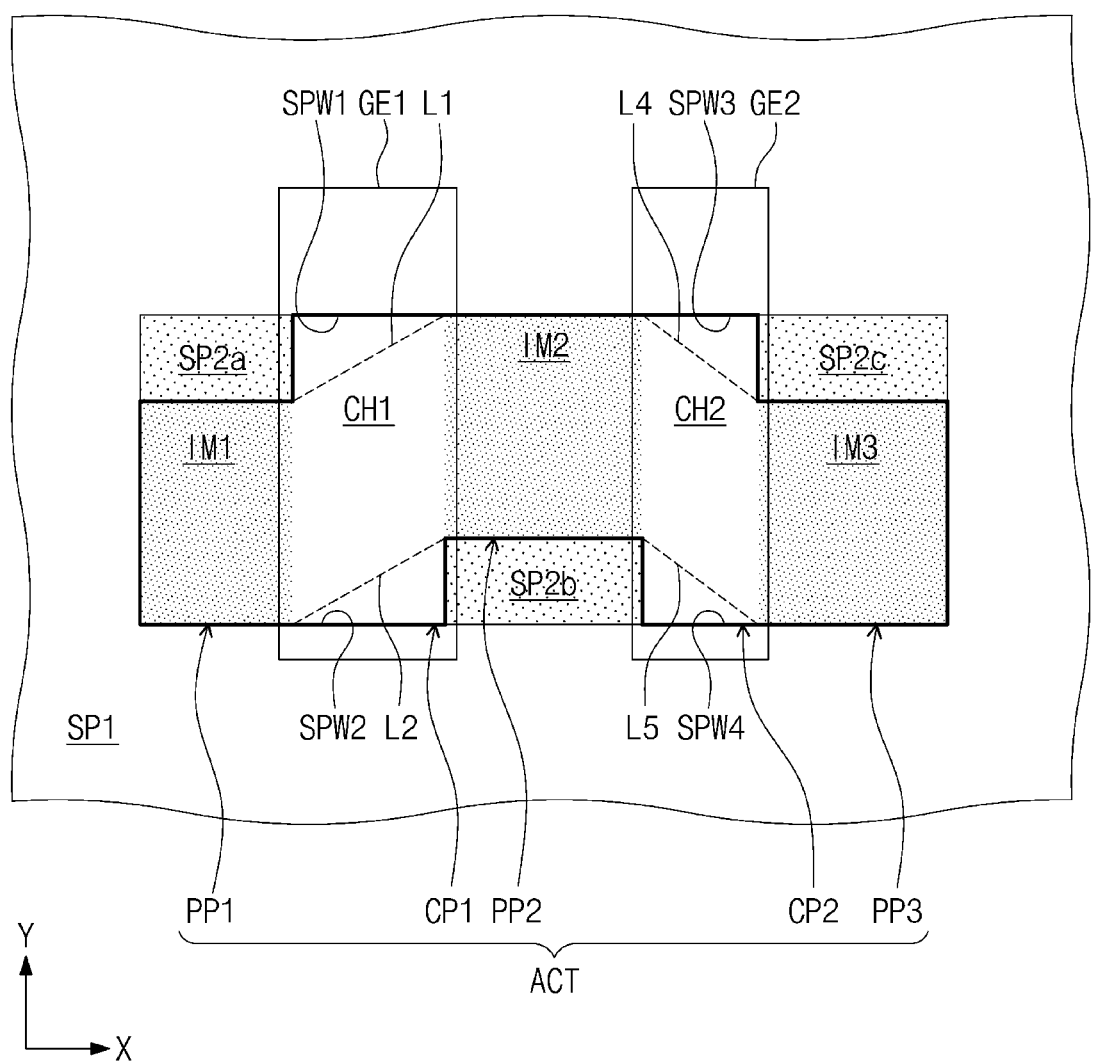

FIGS. 6A and 6B illustrate plan views showing a semiconductor device according to an exemplary embodiment of the present inventive concept.

Referring to FIG. 6A, a semiconductor device 508 according to the present embodiment may be configured such that the first, second, and third impurity regions IM1, IM2, and IM3 may respectively include first, second, and third centers CT1, CT2, and CT3 that are not positioned on a straight line. A third straight line L3 that links the first center CT1 to the second center CT2 may intersect a sixth straight line L6 that links the second center CT2 to the third center CT3. In the present embodiment, the first isolation sidewall SPW1 and the third isolation sidewall SPW3 may be aligned along the first direction X with each other to lie on a straight line. The first isolation sidewall SPW1 and the third isolation sidewall SPW3 may be connected to each other. The second isolation sidewall SPW2 and the fourth isolation sidewall SPW4 may be aligned with each other along the first direction X. The second isolation sidewall SPW2 and the fourth isolation sidewall SPW4 may not be connected to each other. Other configurations may be identical or similar to those discussed above with reference to FIG. 5A.

Referring to FIG. 6B, a semiconductor device 509 according to the present embodiment may be configured such that the active region ACT may be defined by a device isolation layer SP1, a first device isolation area SP2*a*, a second device isolation area SP2*b*, and a third device isolation area SP2*c*. The active region ACT may have the same shape as that of the active region ACT in FIG. 6A. In the present embodiment, the first device isolation area SP2*a* may be interposed between the first impurity region IM1 and the first isolation sidewall SPW1 of the device isolation layer SP1. The second device isolation area SP2*b* may be interposed between the second impurity region IM2 and the second isolation sidewall SPW2 of the device isolation layer SP1. The third device isolation area SP2*c* may be interposed between the third impurity region IM3 and the third isolation sidewall SPW3 of the device isolation layer SP1. Other configurations may be identical or similar to those discussed above with reference to FIG. 6A.

Figure 7:
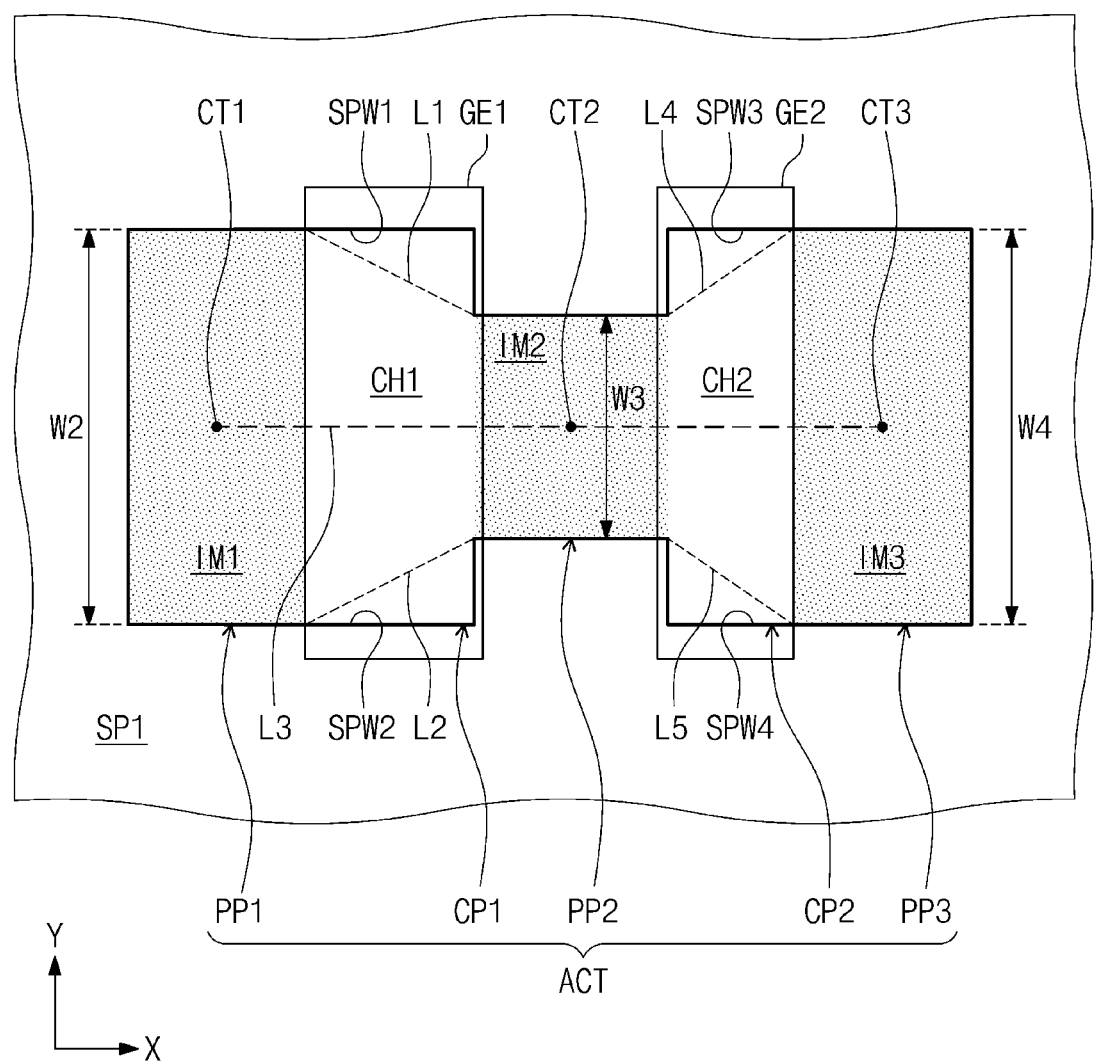
FIGS. 7, 8 and 9 illustrate plan views showing a semiconductor device according to an exemplary embodiment of the present inventive concept.
Figure 8:
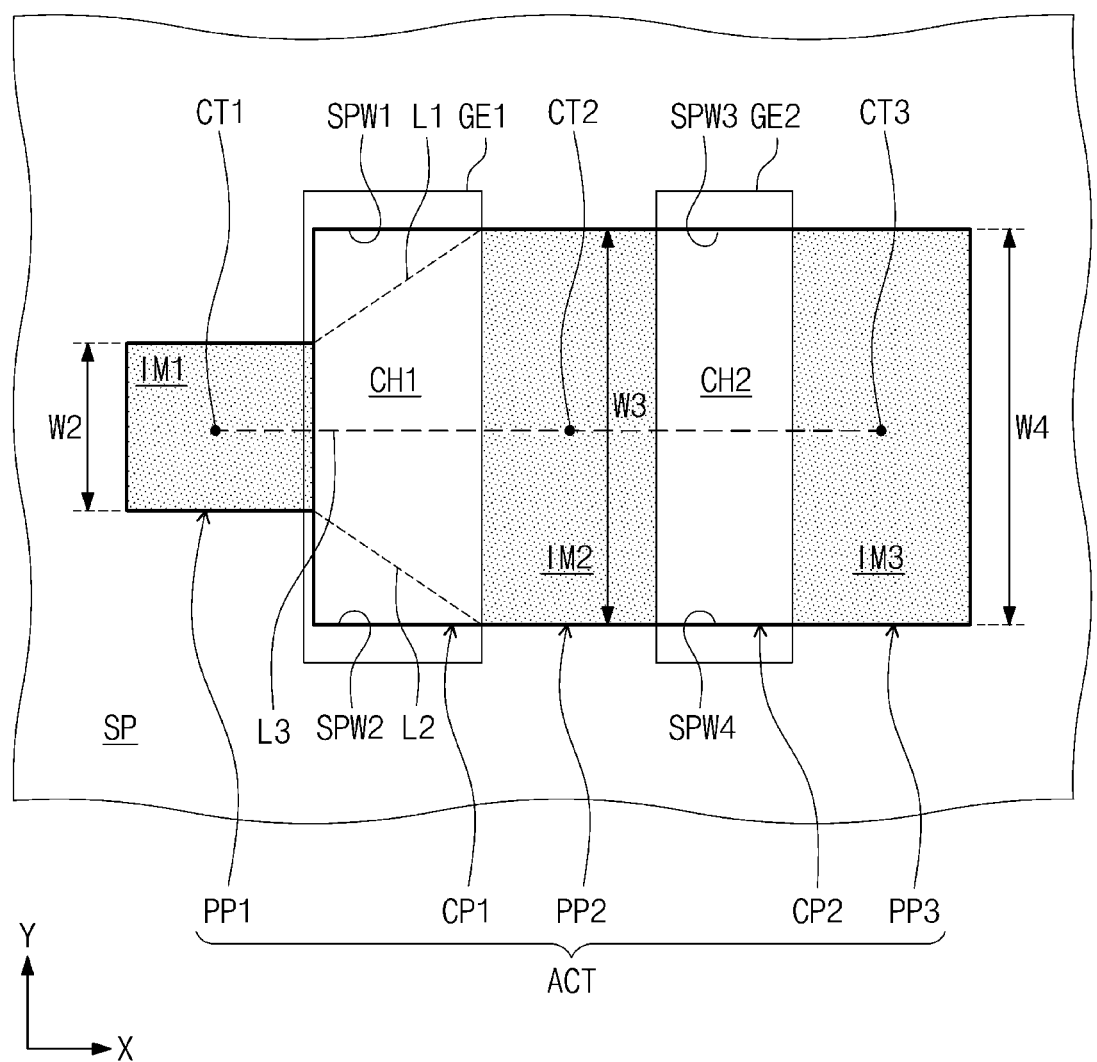
Figure 9:
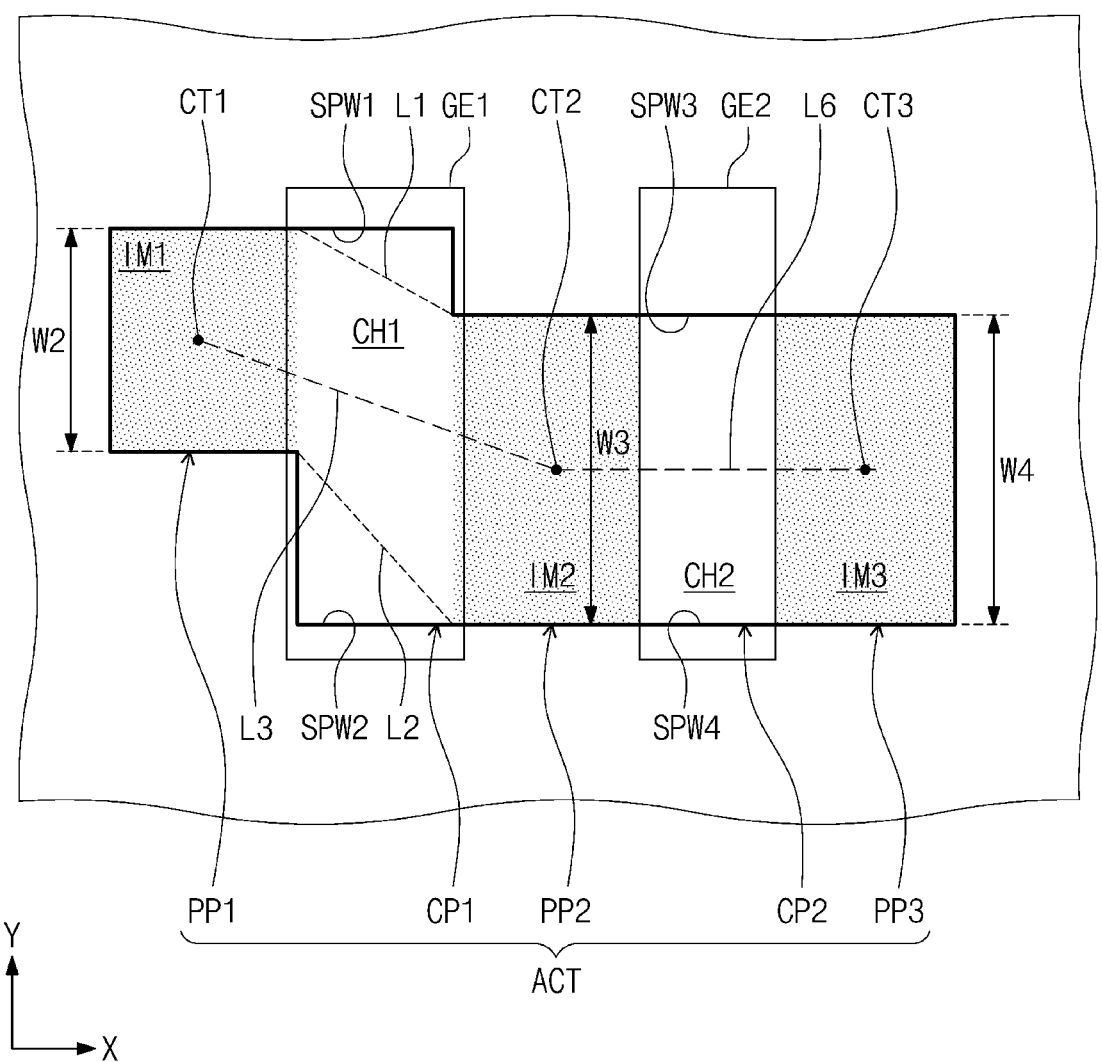

FIGS. 7 to 9 illustrate plan views showing a semiconductor device according to an exemplary embodiment of the present inventive concept.

Referring to FIG. 7, a semiconductor device 510 according to the present embodiment may be configured such that the first, second, and third impurity regions IM1, IM2, and IM3 may respectively include first, second, and third centers CT1, CT2, and CT3, and that the third straight line L3 which links the first, second, and third centers CT1, CT2, and CT3 to each other may be parallel to the first direction X. The second active protrusion PP2 may have a third width W3 less than a second width W2 of the first active protrusion PP1. In addition, the third width W3 of the second active protrusion PP2 may be less than a fourth width W4 of the third active protrusion PP3. The second width W2 may be substantially the same as the fourth width W4. Other process steps may be identical or similar to those discussed above.

Referring to FIG. 8, a semiconductor device 511 according to the present embodiment may be configured such that an overall shape of the active region ACT may be the same as that of the active region ACT of FIG. 1A, and may be different from the semiconductor device 500 of FIG. 1A in that two gate electrodes GE1 and GE2 extend across the active region ACT. The first active protrusion PP1 may have a second width W2 less than each of a third width W3 of the second active protrusion PP2 and a fourth width W4 of the third active protrusion PP3. The third width W3 may be substantially the same as the fourth width W4. The first, second, and third impurity regions IM1, IM2, and IM3 may respectively include first, second, and third centers CT1, CT2, and CT3, and the third straight line L3 that links the first, second, and third centers CT1, CT2, and CT3 to each other may be parallel to the first direction X. Other process steps may be identical or similar to those discussed above.

Referring to FIG. 9, a semiconductor device 512 according to the present embodiment may be configured such that the first, second, and third impurity regions IM1, IM2, and IM3 may respectively include first, second, and third centers CT1, CT2, and CT3 that are not positioned on a straight line. The third straight line L3 that links the first center CT1 to the second center CT2 may intersect the sixth straight line L6 that links the second center CT2 to the third center CT3. Other process steps may be identical or similar to those discussed above.

Figure 10:
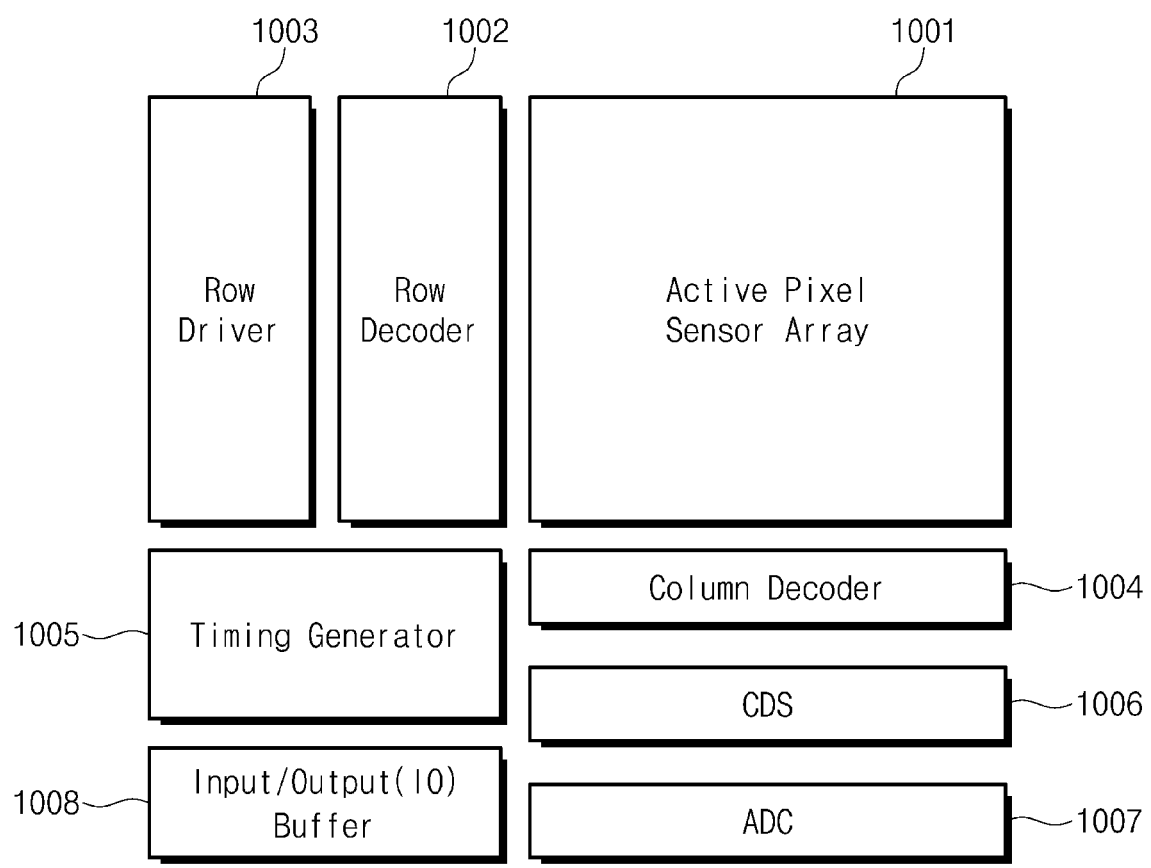
FIG. 10 illustrates a block diagram showing an image sensor according to an exemplary embodiment of the present inventive concept.

FIG. 10 illustrates a block diagram showing an image sensor according to an exemplary embodiment of the present inventive concept.

Referring to FIG. 10, an image sensor may include an active pixel sensor array 1001, a row decoder 1002, a row driver 1003, a column decoder 1004, a timing generator 1005, a correlated double sampler (CDS) 1006, an analog-to-digital converter (ADC) 1007, and an input/output (I/O) buffer 1008.

The active pixel sensor array 1001 may include a plurality of two-dimensionally arranged unit pixels, each of which is configured to convert optical signals into electrical signals. The active pixel sensor array 1001 may be driven by a plurality of driving signals such as a pixel select signal, a reset signal, and a charge transfer signal from the row driver 1003. The correlated double sampler 1006 may be provided with the converted electrical signals.

The row driver 1003 may provide the active pixel sensor array 1001 with several driving signals for driving several unit pixels in accordance with a decoded result obtained from the row decoder 1002. When the unit pixels are arranged in a matrix shape, the driving signals may be provided for respective rows.

The timing generator 1005 may provide timing and control signals to the row decoder 1002 and the column decoder 1004.

The correlated double sampler 1006 may receive the electrical signals generated from the active pixel sensor array 1001, and may hold and sample the received electrical signals. The correlated double sampler 1006 may perform a double sampling operation to sample a specific noise level and a signal level of the electrical signal, and then may output a difference level corresponding to a difference between the noise and signal levels.

The analog-to-digital converter 1007 may convert analog signals, which correspond to the difference level received from the correlated double sampler 1006, into digital signals, and then may output the converted digital signals.

The input/output buffer 1008 may latch the digital signals and then sequentially output the latched digital signals to an image signal processing unit in response to the decoded result obtained from the column decoder 1004.

Figure 11:
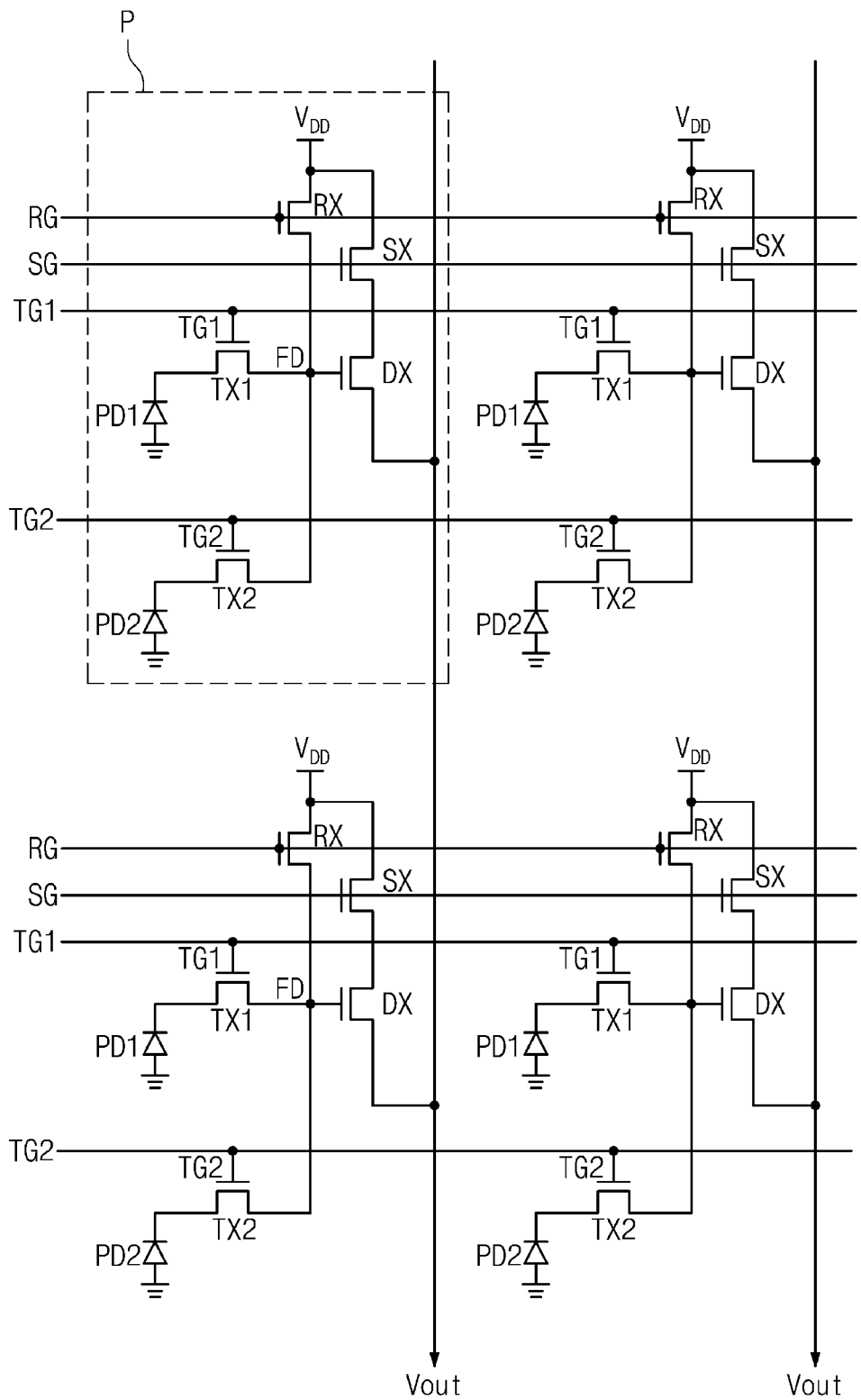
FIG. 11 illustrates a circuit diagram showing an active pixel sensor array of an image sensor according to some embodiments of the present inventive concepts.

FIG. 11 illustrates a circuit diagram showing an active pixel sensor array of an image sensor according to an exemplary embodiment of the present inventive concept.

Referring to FIGS. 10 and 11, the active pixel sensor array 1001 may include a plurality of unit pixel groups P. and the unit pixel groups P may be arranged in a matrix shape. Each of the unit pixel groups P may include a first transfer transistor TX1, a second transfer transistor TX2, and logic transistors RX, SX, and DX. The logic transistors RX, SX and DX may include a reset transistor RX, a selection transistor SX, and a source follower transistor DX.

The first transfer transistor TX1 may include a first transfer gate electrode TG1 and a first photoelectric conversion element PD1, and the second transfer transistor TX2 may include a second transfer gate electrode TG2 and a second photoelectric conversion element PD2. The first and second transfer transistors TX1 and TX2 may share a charge detection node or a floating diffusion region FD. The number of transfer transistors is not limited to two, but may be variously changed.

The first and second photoelectric conversion elements PD1 and PD2 may generate and accumulate photo-charges in proportion to an amount of externally incident light. For example, the first and second photoelectric conversion elements PD1 and PD2 may be one of a photo diode, a photo transistor, a photo gate, a pinned photo diode (PPD), and any combination thereof.

The first and second transfer transistors TX1 and TX2 may transfer charges accumulated in the first and second photoelectric conversion elements PD1 and PD2 to the charge detection node FD (or the floating diffusion region). The first and second transfer gates TG1 and TG2 may receive complementary signals. For example, the charges may be transferred to the charge detection node FD from one of the first or second photoelectric conversion elements PD1 and PD2.

The charge detection node FD may receive and accumulatively store the charges generated from the first and second photoelectric conversion elements PD1 and PD2. The source follower transistor DX may be controlled by an amount of photo-charges accumulated in the charge detection node FD.

The reset transistor RX may periodically reset the charges accumulated in the charge detection node FD. For example, the reset transistor RX may have a drain region connected to the charge detection node FD and a source region connected to a power voltage $V_{DD}$. When the reset transistor RX is turned on, the charge detection node FD may receive the power voltage $V_{DD}$ connected to the source region of the reset transistor RX. Accordingly, when the reset transistor RX is turned on, the charges accumulated in the charge detection node FD may be exhausted, and thus, the charge detection node FD may be reset.

The source follower transistor DX and a constant current source positioned outside the unit pixel P may be combined with each other to serve as a source follower buffer amplifier. A source potential of the source follower transistor DX may be varied in proportion to an amount of charges accumulated in the charge detection node FD. The source follower transistor DX may amplify a variation in electrical potential of the charge detection node FD and may output the amplified electrical potential to an output line $V_{OUT}$.

The selection transistor SX may select each row of the unit pixel groups P to be readout. When the selection transistor SX is turned on, a drain region of the selection transistor SX may receive the power voltage Van, and the drain region of the selection transistor SX is connected to a source region of the source follower transistor DX.

Figure 12:
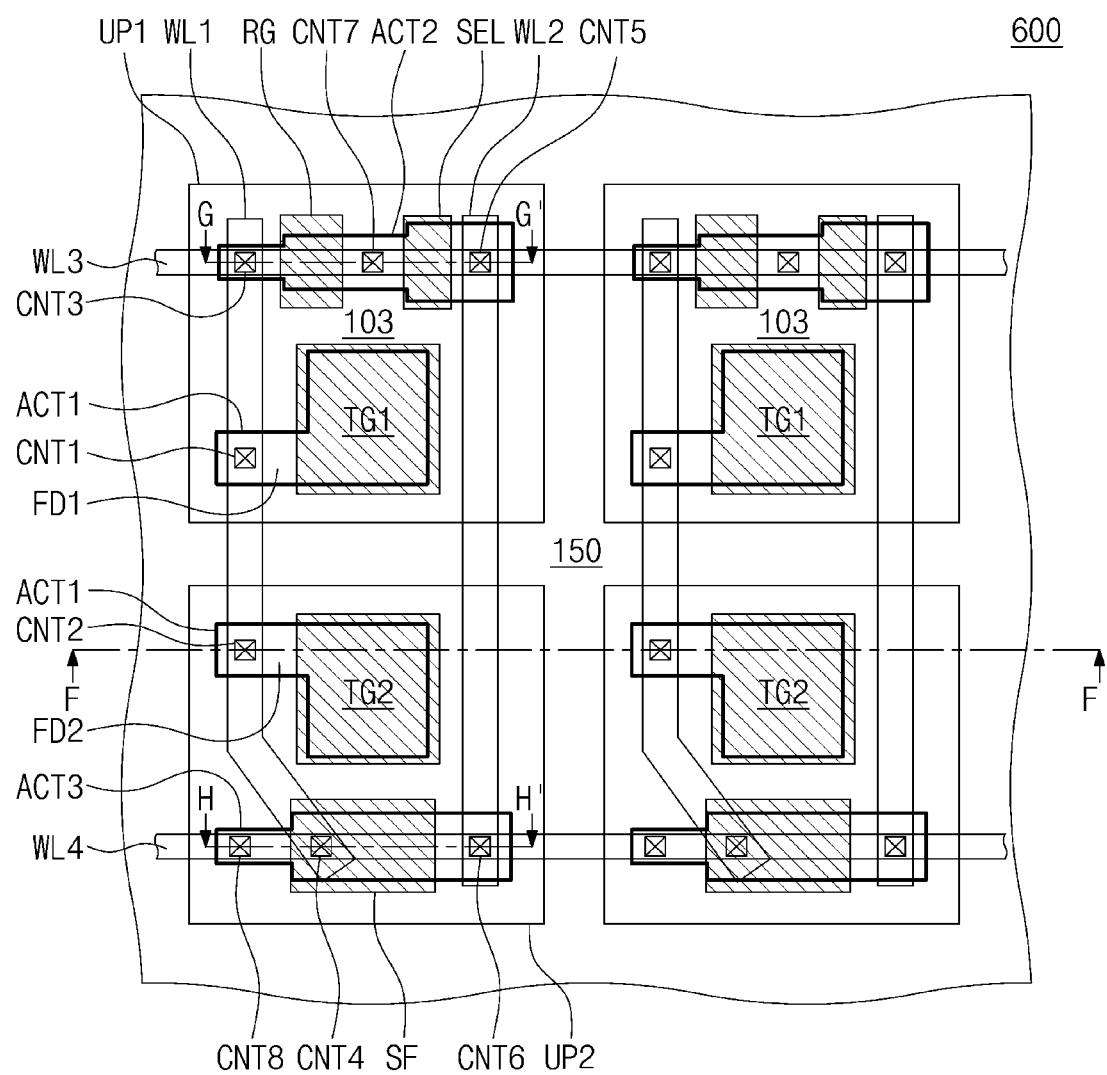
FIG. 12 illustrates a plan view showing an image sensor according to an exemplary embodiment of the present inventive concept.
Figure 13A:
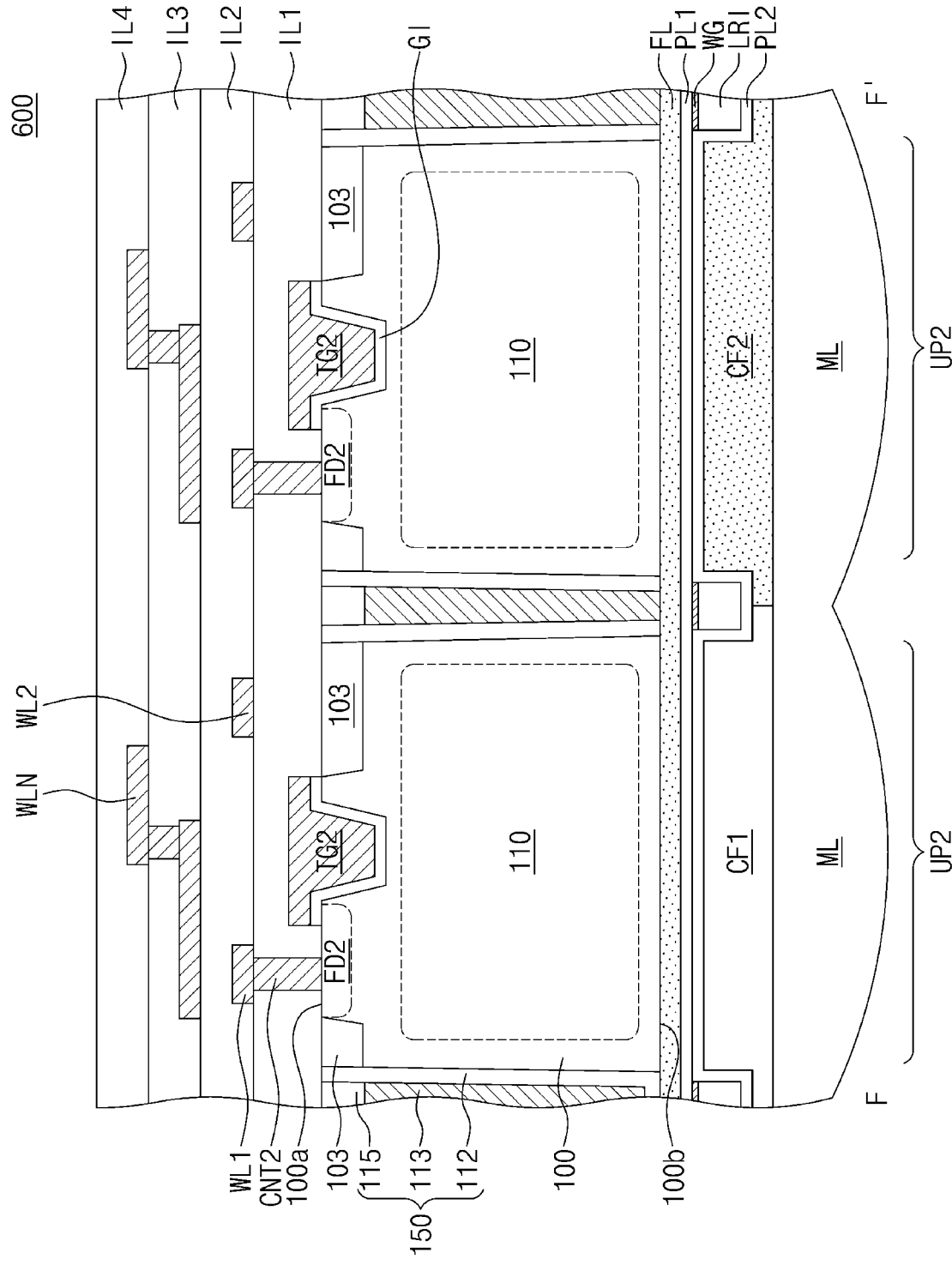
FIG. 13A illustrates a cross-sectional view taken along line F-F' of FIG. 12.
Figure 13B:
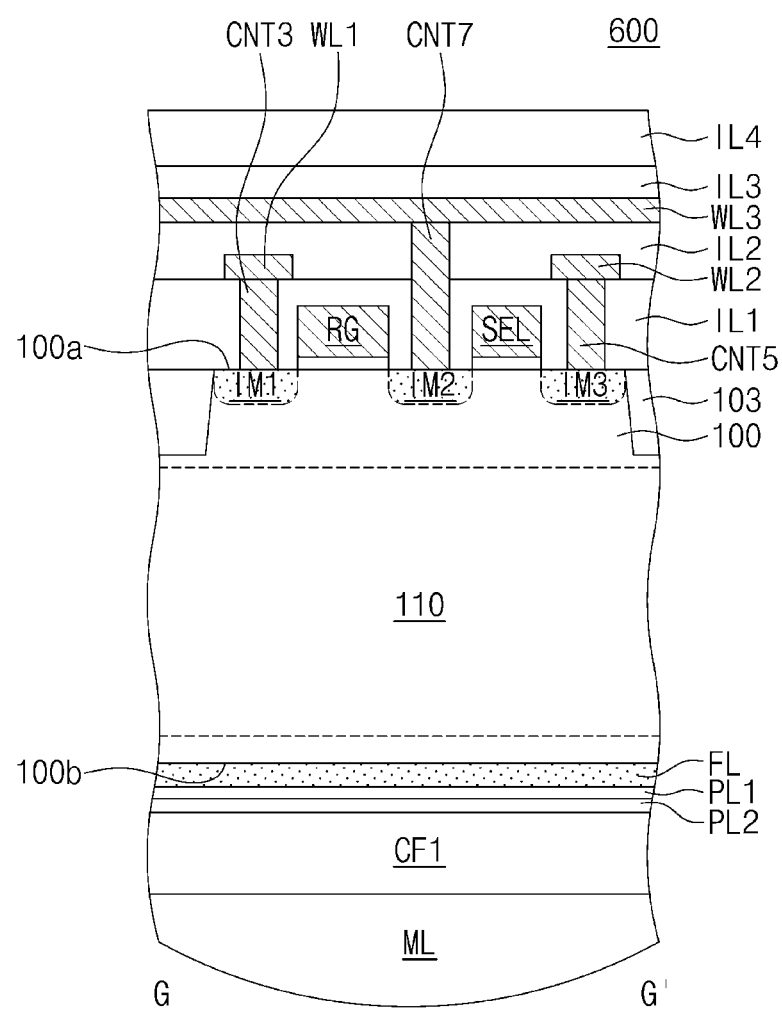
FIG. 13B illustrates a cross-sectional view taken along line G-G' of FIG. 12.
Figure 13C:
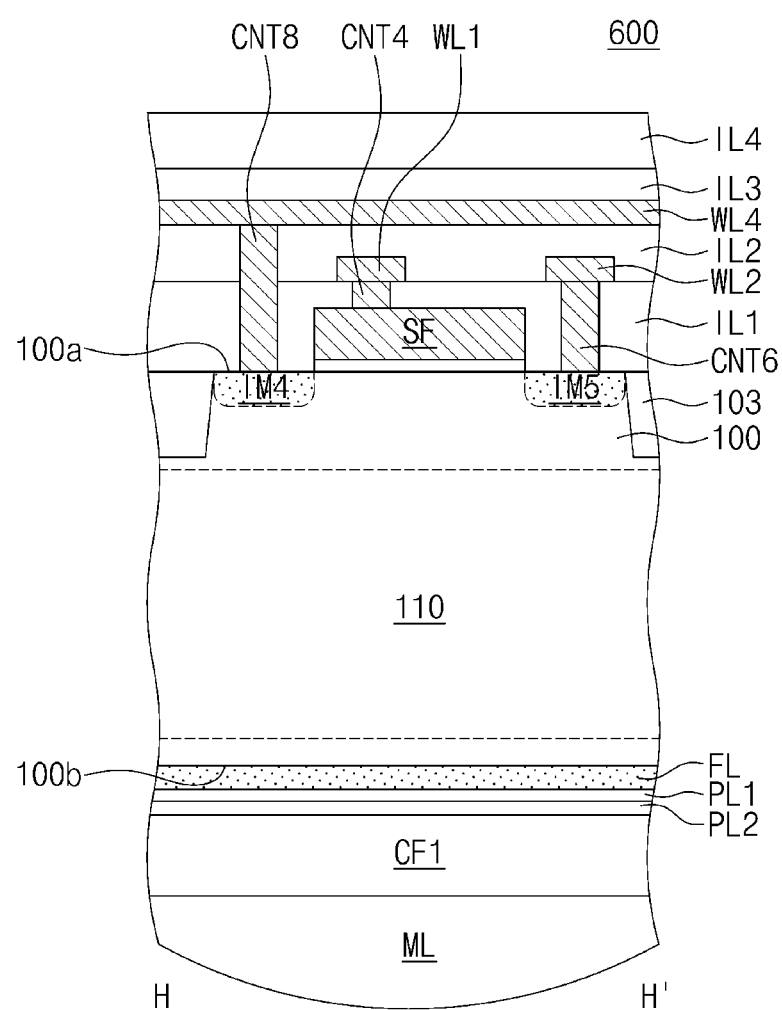
FIG. 13C illustrates a cross-sectional view taken along line H-H' of FIG. 12.

FIG. 12 illustrates a plan view showing an image sensor according to an exemplary embodiment of the present inventive concept. FIG. 13A illustrates a cross-sectional view taken along line F-F' of FIG. 12. FIG. 13B illustrates a cross-sectional view taken along line G-G' of FIG. 12. FIG. 13C illustrates a cross-sectional view taken along line H-H' of FIG. 12.

Referring to FIGS. 12, 13A, 13B, and 13C, an image sensor 600 according to an exemplary embodiment of the present inventive concept may include a substrate 100. The substrate 100 may be, for example, a single-crystalline silicon wafer, a silicon epitaxial layer, or a silicon-on-insulator (SOI) substrate. For example, the substrate 100 may be doped with impurities having a first conductivity type. In the present embodiment, the first conductivity type may be p-type, as an example. The substrate 100 may have a first surface 100a and a second surface 100b that are opposite to each other. The substrate 100 may include a plurality of unit pixels UP1 and UP2. The unit pixels UP1 and UP2 may include first unit pixels UP1 and second unit pixels UP2. A single first unit pixel UP1 and a single second unit pixel UP2 adjacent thereto may constitute a single unit pixel group P of FIG. 11.

The unit pixels UP1 and UP2 may include corresponding photoelectric conversion parts 110 in the substrate 100. The photoelectric conversion parts 110 may be doped with impurities having a second conductivity type opposite to the first conductivity type. The second conductivity type may be, for example, n-type. The n-type impurities doped in the photoelectric conversion part 110 and the p-type impurities doped in the substrate 100 adjacent to the photoelectric conversion part 110 may constitute a PN junction to provide a photodiode.

The substrate 100 may have therein a device isolation part 103 adjacent to the first surface 100a. The device isolation part 103 may correspond to the device isolation part SP discussed with reference to FIGS. 1A to 9. The device isolation part 103 may limit active regions ACT1, ACT2, and ACT3 in the first and second unit pixels UP1 and UP2. For example, the device isolation part 103 may limit a first active region ACT1 and a second active region ACT2 on the first unit pixel UP1. The device isolation part 103 may limit a first active region ACT1 and a third active region ACT3 on the second unit pixel UP2.

The transfer transistors TX1 and TX2 of FIG. 11 may be disposed on the first active regions ACT1. For example, the first transfer gate electrode TG1 may be disposed on the first active region ACT1 for the first unit pixel UP1. A first floating diffusion region FD1 may be disposed on a side of the first transfer gate electrode TG1 on the first active region ACT1. The second transfer gate electrode TG2 may be disposed on the first active region ACT1 for the second unit pixel UP2. A second floating diffusion region FD2 may be disposed on a side of the second transfer gate electrode TG2 on the first active region ACT1.

The first and second transfer gate electrodes TG1 and TG2 may have a vertical type in which the first and second transfer gate electrodes TG1 and TG2 are at least partially inserted into the substrate 100. In addition, the first and second transfer gate electrodes TG1 and TG2 may have a planar type in which the first and second transfer gate electrodes TG1 and TG2 have their flat bottom surfaces without extending into the substrate 100. A gate dielectric layer GI may be interposed between the substrate 100 and each of the first and second transfer gate electrodes TG1 and TG2. The first and second floating diffusion regions FD1 and FD2 may be doped with impurities having the second conductivity type opposite to the first conductivity type.

The reset transistor RX and the selection transistor SX of FIG. 11 may be disposed on the second active region ACT2. A reset gate electrode RG and a selection gate electrode SEL may extend across the second active region ACT2. On the second active region ACT2, first to third impurity regions IM1 to IM3 may be disposed on corresponding sides of the reset and selection gate electrodes RG and SEL. For example, the reset gate electrode RG may be disposed between the first impurity region IM1 and the second impurity region IM2, and the selection gate electrode RG may be disposed between the second impurity region IM2 and the third impurity region IM3. The first to third impurity regions IM1 to IM3 may be doped with impurities having the second conductivity type opposite to the first conductivity type. In the substrate 100, the photoelectric conversion part 110 may extend below and may be spaced apart from the first to third impurity regions IM1 to IM3.

In the present embodiment, the second active region ACT2 may have a shape depicted in FIG. 4A. The second active region ACT2, however, is not limited to the shape depicted in FIG. 4A, but may have one of the shapes shown in FIGS. 4B to 9. Therefore, even when the substrate 100 has therein a channel region created by voltage applied to the reset gate electrode RG and/or the selection gate electrode SEL, the channel region may not contact a sidewall of the device isolation part 103, which may prevent or reduce signal noise, dark current, and/or white spot. In the present embodiment, the reset transistor RX and the selection transistor SX may be disposed on a single second active region ACT2, but may be individually placed on separate active regions from each other.

The source follower transistor DX of FIG. 11 may be disposed on the third active region ACT3. A source follower gate electrode SF may extend across the third active region ACT3. Fourth and fifth impurity regions IM4 and IM5 may be disposed in the third active region ACT3 and on opposite sides of the source follower gate electrode SF. The fourth and fifth impurity regions IM4 and IM5 may be doped with impurities having the second conductivity type opposite to the first conductivity type. In the substrate 100, the photoelectric conversion part 110 may extend below and may be spaced apart from the fourth and fifth impurity regions IM4 and IM5.

In the present embodiment, the third active region ACT3 has the shape shown in FIG. 1A, but may have another one of the shapes shown in FIGS. 2B to 3B. Therefore, even when the substrate 100 has therein a channel region created by voltage applied to the source follower gate electrode SF, the channel region may not contact a sidewall of the device isolation part 103, which may prevent or reduce signal noise, dark current, and/or white spot.

The substrate 100 may have therein a pixel separation part 150 (e.g., another device isolation part) that separate and/or limit the unit pixels UP1 and UP2 from each other. The pixel separation part 150 may have, for example, a net shape or a lattice shape when viewed in plan. For example, the pixel separation part 150 may have openings therein. The pixel separation part 150 may penetrate the device isolation part 103. The pixel separation part 150 may include a conductive pattern 113 disposed in the substrate 100, a first dielectric pattern 112 interposed between the conductive pattern 113 and the substrate 100, and a second dielectric pattern 115 on the conductive pattern 113. The conductive pattern 113 may have a net shape or a lattice shape when viewed in plan. The conductive pattern 113 may include, for example, impurity-doped polysilicon or metal. The first and second dielectric patterns 112 and 115 may include, for example, a silicon oxide layer.

The image sensor 600 may be a backside illumination image sensor. Light may be incident through the second surface 100b of the substrate 100. The PN junction may create electron-hole pairs from the incident light. These created electrons may migrate toward the photoelectric conversion part 110. When a voltage is applied to the first transfer gate electrode TG1 (or the second transfer gate electrode TG2), the electrons may move toward the first floating diffusion region FD1 (or the second floating diffusion region FD2).

The first surface 100a may be covered with interlayer dielectric layers IL1 to IL4. The interlayer dielectric layers IL1 to IL4 may be formed of multiple layers including at least one of a silicon oxide layer, a silicon nitride layer, a silicon oxynitride layer, and/or a porous low-k dielectric layer. The interlayer dielectric layers IL1 to IL4 may have therebetween or therein wiring lines WL1 to WL4 and contact plugs CNT1 to CNT8.

The first floating diffusion region FD1 and the second floating diffusion region FD2 may be connected to a first wiring line WL1 through a first contact plug CNT1 and a second contact plug CNT2, respectively. The first wiring line WL1 may be connected through a third contact plug CNT3 to the first impurity region IM1 on a side of the reset gate electrode RG. In addition, the first wiring line WL1 may be connected through a fourth contact plug CNT4 to the source follower gate electrode SF.

The second wiring line WL2 may be connected through a fifth contact plug CNT5 to the third impurity region IM3 on a side of the selection gate electrode SEL, and may be connected through a sixth contact plug CNT6 to the fifth impurity region IM5 on a side of the source follower gate electrode SF.

A third wiring line WL3 may be connected through a seventh contact plug CNT7 to the second impurity region IM2 between the reset gate electrode RG and the selection gate electrode SEL. A fourth wiring line WL4 may be connected through an eighth contact plug CNT8 to the fourth impurity region IM4 on a side of the source follower gate electrode SF. The third wiring line WL3, the fourth wiring line WL4, and the fourth impurity region IM4 may each extend in the first direction X.

A fixed charge layer FL may be disposed on and in contact with the second surface 100b. The fixed charge layer FL may be formed of a single- or multi-layered metal oxide layer including oxygen whose amount is less than its stoichiometric ratio or a single- or multi-layered metal fluoride layer including fluorine whose amount is less than its stoichiometric ratio. The fixed charge layer FL may thus have a negative fixed charge. The fixed charge layer FL may be a single layer or multiple layers of one of metal oxide and/or metal fluoride that include at least one metal such as hafnium (Hf), zirconium (Zr), aluminum (Al), tantalum (Ta), titanium (Ti), yttrium (Y), and lanthanides. For example, the fixed charge layer FL may include one or more of a hafnium oxide layer and/or an aluminum oxide layer. The fixed charge layer FL may suppress or reduce dark current and white spot.

A first protection layer PL1 may be disposed on the fixed charge layer FL. The first protection layer PL1 may include at least one of metal oxide, PETEOS, SiOC, SiO$_2$, and SiN. A net-shaped or lattice shaped light-shield grid pattern WG may be disposed on the first protection layer PL1. The light-shield grid pattern WG may include, for example, tungsten and/or titanium. The light-shield grid pattern WG may overlap the pixel separation part 150.

A low-refractive pattern LR1 may be disposed in the light-shield grid pattern WG. When viewed in plan, the low-refractive pattern LR1 may overlap the light-shield grid pattern WG, and may have the same shape as that of the light-shield grid pattern WG. For example, the low-refractive pattern LR1 may have a sidewall aligned with that of the light-shield grid pattern WG. The first protection layer PL1, the low-refractive pattern LR1, and the sidewall of the light-shield grid pattern WG may be covered with a second protection layer PL2. The second protection layer PL2 may include at least one of metal oxide, PETEOS, SiOC, SiO$_2$, and/or SiN. Color filters CF1 and CF2 may be disposed on the second protection layer PL2.

The low-refractive pattern LR1 may include an organic material. The low-refractive pattern LR1 may have a refractive index less than those of the color filters CF1 and CF2. For example, the low-refractive pattern LR1 may have a refractive index equal to or less than about 1.3. The light-shield grid pattern WG and the low-refractive pattern LR1 may prevent crosstalk between neighboring unit pixels UP1 and UP2. Each of the color filters CF1 and CF2 may have one of blue, green, and red colors. The color filters CF1 and CF2 may be arranged in one of a Bayer pattern, a 2×2 Tetra pattern, or a 3×3 Nona pattern. In addition, the color filters CF1 and CF2 may include different colors such as cyan, magenta, or yellow.

A micro-lens array layer ML may be disposed on the color filters CF1 and CF2. The micro-lens array layer ML may include convex lenses that correspondingly overlap the unit pixels UP1 and UP2.

Figure 14:
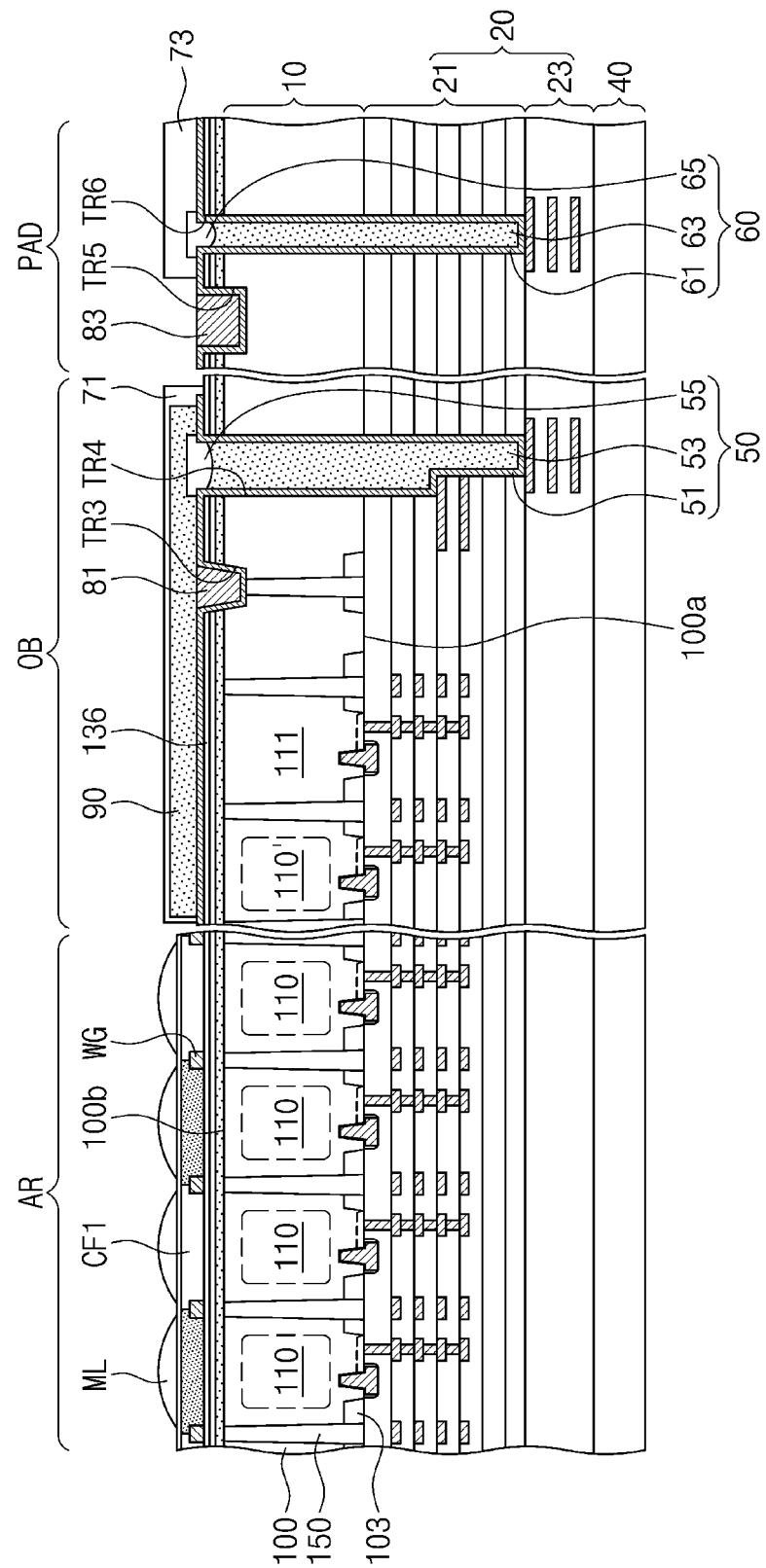
FIG. 14 illustrates a cross-sectional view showing an image sensor according to an exemplary embodiment of the present inventive concept.

FIG. 14 illustrates a cross-sectional view showing an image sensor according to an exemplary embodiment of the present inventive concept.

Referring to FIG. 14, an image sensor according to an exemplary embodiment of the present inventive concept may include a substrate 100 including a pixel region AR, an optical black region OB, and a pad region PAD, and may also include a wiring layer 20 on a first surface 100a of the substrate 100 and a base substrate 40 on the wiring layer 20. The wiring layer 20 may include an upper wiring layer 21 and a lower wiring layer 23. The pixel region AR may include a plurality of unit pixels (e.g., UP1 and UP2 of FIGS. 12 to 13C). The pixel region AR may be substantially the same as that discussed above with reference to FIGS. 12 to 13C.

On the optical black region OB, the substrate 100 may be provided thereon with a first connection structure 50, a first conductive pad 81, and a bulk color filter 90. The first connection structure 50 may include a first light-shield pattern 51, a dielectric pattern 53, and a first capping pattern 55.

The first light-shield pattern 51 may be disposed on a second surface 100b of the substrate 100. For example, the first light-shield pattern 51 may cover a second dielectric layer 136 on the second surface 100b, and may also conformally cover an inner wall of a third trench TR3 and an inner wall of a fourth trench TR4. The first light-shield pattern 51 may penetrate a photoelectric conversion layer 10 and the upper wiring layer 21, and may connect the photoelectric conversion layer 10 to the wiring layer 20. For example, the first light-shield pattern 51 may be in contact with wiring lines in the upper and lower wiring layers 21 and 23 and with a pixel separation part 150 in the photoelectric conversion layer 10. Therefore, the first connection structure 50 may be electrically connected to wiring lines in the wiring layer 20. The first light-shield pattern 51 may include a metallic material, such as tungsten. The first light-shield pattern 51 may block light incident onto the optical black region OB.

A first conductive pad 81 may be provided in the third trench TR3, and may be disposed on first light shield pattern 51 to fill a remaining portion of the third trench TR3. The first conductive pad 81 may include a metallic material, such as aluminum. The first conductive pad 81 may be connected to the conductive pattern 113 of FIG. 13A. A negative bias voltage may be applied through the first conductive pad 81 to the conductive pattern 113. Therefore, it may be possible to prevent or reduce white spot and/or dark current.

The dielectric pattern 53 may fill a remaining portion of the fourth trench TR4. In the fourth trench TR4, the dielectric pattern 53 may be disposed on the first light shield pattern 51. The dielectric pattern 53 may penetrate the photoelectric conversion layer 10 and all or a portion of the wiring layer 20. The first capping pattern 55 may be provided on the dielectric pattern 53. For example, the first capping pattern 55 may be disposed on a top surface of dielectric pattern 53 in the fourth trench TR4.

The bulk color filter 90 may be provided on the first conductive pad 81, the first light-shield pattern 51, and the first capping pattern 55. For example, the bulk color filter 90 may cover the first conductive pad 81, the first light-shield pattern 51, and the first capping pattern 55. A first protection layer 71 may be provided on and cover the bulk color filter 90.

A photoelectric conversion part 110' and a dummy part 111 may be provided on the optical black region OB. The photoelectric conversion part 110' may be doped with impurities, for example, the second conductivity type different from the first conductivity type. The second conductivity type may be, for example, n-type. The pixel region AR may include a plurality of unit pixels. The photoelectric conversion part 110' may have a similar structure to that of a photoelectric conversion part 110 on the pixel region AR. The dummy part 111 may not be doped with impurities. The dummy part 111 may generate signals that are used as information to remove subsequent process noise.

On the pad region PAD, the substrate 100 may be provided thereon with a second connection structure 60, a second conductive pad 83, and a second protection layer 73. The second connection structure 60 may include a second light-shield pattern 61, a dielectric pattern 63, and a second capping pattern 65.

The second light-shield pattern 61 may be disposed on the second surface 100b of the substrate 100. For example, the second light-shield pattern 61 may cover the second dielectric layer 136 on the second surface 100b, and may conformally cover an inner wall of a fifth trench TR5 and an inner wall of a sixth trench TR6. The second light-shield pattern 61 may penetrate the photoelectric conversion layer 10 and the upper wiring layer 21, and may connect the photoelectric conversion layer 10 to the wiring layer 20. For example, the second light-shield pattern 61 may contact wiring lines in the lower wiring layer 23. Therefore, the second connection structure 60 may be electrically connected to wiring lines in the wiring layer 20. The second light-shield pattern 61 may include a metallic material, such as tungsten.

A second conductive pad 83 may be provided on the second light shield pattern 61 in the fifth trench TR5 to at least partially fill a remaining portion of the fifth trench TR5. The second conductive pad 83 may include a metallic material, such as aluminum. The second conductive pad 83 may serve as an electrical connection path through which an image sensor device is connected to an external apparatus. The dielectric pattern 63 may be disposed on the second light shield pattern 61 in the sixth trench TR6 to at least partially fill a remaining portion of the sixth trench TR6. The dielectric pattern 63 may penetrate the photoelectric conversion layer 10 and all or a portion of the wiring layer 20. The second capping pattern 65 may be provided on the dielectric pattern 63. The second protection layer 73 may cover the second capping pattern 65 and at least a portion of the second light-shield pattern 61.

A current applied through the second conductive pad 83 may flow to the pixel separation part 150 through the second light-shield pattern 61, wiring lines in the wiring layer 20, and the first light-shield pattern S1. The photoelectric conversion parts 110 and 110' and the dummy part 111 may generate electrical signals, and the electrical signals may be outwardly transmitted through wiring lines in the wiring layer 20, the second light-shield pattern 61, and the second conductive pad 83.

According to an exemplary embodiment of the present inventive concept, an image sensor may be configured such that at least one of reset, source follower, and selection transistors may have an asymmetric active region, and that a channel region between source/drain regions may contact none of sidewalls of a device isolation layer. Therefore, random telegraph signal (RTS) noise, dark current, and/or white spot may be prevented or reduced, and clear images may be acquired.

According to an exemplary embodiment of the present inventive concept, a semiconductor device may be configured such that an active region may have an asymmetric structure to allow a channel region between source/drain regions to have no contact with sidewalls of a device isolation layer. Accordingly, noise of electrical signals generated from a transistor may be reduced to increase reliability of the semiconductor device.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. An image sensor, comprising:
   a first device isolation part in a substrate and defining a structured active region;
   a first gate electrode that extends in a first direction across the active region and has a first gate sidewall and a second gate sidewall that are spaced apart from each other in a second direction orthogonal to the first direction; and
   a first impurity region and a second impurity region disposed in the active region and respectively disposed at the first gate sidewall and the second gate sidewall,
   wherein the active region includes:
      a first active central part that overlaps the first gate electrode;
      a first active protrusion in which the first impurity region is disposed; and
      a second active protrusion in which the second impurity region is disposed,
   wherein the first device isolation part has a first isolation sidewall overlapping the first active central part, wherein the first isolation sidewall extends parallel to the second direction,
   wherein a first straight line is at least partially spaced apart from the first isolation sidewall, wherein the first straight line links a first point to a second point, wherein the first point is where the first active protrusion meets the first active central part and is adjacent to the first isolation sidewall, and the second point is where the second active protrusion meets the first active central part and is adjacent to the first isolation sidewall, and
   wherein the first isolation sidewall vertically overlaps the first gate electrode.

2. The image sensor of claim 1, wherein the first straight line makes an acute angle with respect to the first isolation sidewall.

3. The image sensor of claim 1, wherein
   the first impurity region and the second impurity region have substantially the same size and the same shape as each other, and
   a second straight line is not parallel to the second direction, wherein the second straight line links a center of the first impurity region to a center of the second impurity region.

4. The image sensor of claim 1, wherein
   the first impurity region has a first width in the first direction,
   the second impurity region has a second width in the first direction, wherein the second width is greater than the first width, and
   a second straight line is parallel to the second direction, wherein the second straight line links a center of the first impurity region to a center of the second impurity region.

5. The image sensor of claim 1, wherein the first device isolation part includes a device isolation layer and an isolation area,
   wherein the first isolation sidewall corresponds to a sidewall of the device isolation layer,
   wherein the first isolation sidewall extends beyond the first gate sidewall and the second gate sidewall, and
   wherein the isolation area is between the first isolation sidewall and the first impurity region and is doped with impurities having a conductivity type opposite to a conductivity type of impurities doped in the first impurity region.

6. The image sensor of claim 1, further comprising:
   a second gate electrode extending in the first direction across the active region and is spaced apart from the first gate electrode, wherein the second gate electrode includes a third gate sidewall and a fourth gate sidewall, wherein the third gate sidewall is adjacent to the second impurity region, and the fourth gate sidewall is opposite to the third gate sidewall; and
   a third impurity region in the active region and adjacent to the fourth gate sidewall,
   wherein the active region further includes:
      a second active central part that overlaps the second gate electrode; and
      a third active protrusion in which the third impurity region is disposed,
   wherein the first device isolation part further includes a second isolation sidewall overlapping the second active central part, wherein the second isolation sidewall is parallel to the second direction, and wherein a second straight line is at least partially spaced apart from the second isolation sidewall, wherein the second straight line links a third point to a fourth point, wherein the third point is where the second active protrusion meets the second active central part and is adjacent to the second isolation sidewall, and the fourth point is where the third active protrusion meets the second active central part and is adjacent to the second isolation sidewall.

7. The image sensor of claim 6, wherein the first isolation sidewall and the second isolation sidewall are aligned or misaligned with each other in the second direction.

8. The image sensor of claim 1, wherein the first gate electrode corresponds to a gate electrode of at least one of a reset transistor, a source follower transistor, or a selection transistor.

9. The image sensor of claim 1, wherein
the substrate has a first surface and a second surface that are opposite to each other,
the first device isolation part is adjacent to the first surface and spaced apart from the second surface, and
the image sensor further comprises a second device isolation part that penetrates the first device isolation part and the substrate, wherein the second device isolation part separates a plurality of unit pixels from each other,
wherein the active region is in each of the plurality of unit pixels.

10. An image sensor, comprising:
a pixel separation part in a substrate and separating a first unit pixel and a second unit pixel from each other;
a first device isolation part in the first unit pixel and defining a structured first active region;
a first gate electrode that extends in a first direction across the first active region and bas a first gate sidewall and a second gate sidewall that are spaced apart from each other in a second direction orthogonal to the first direction; and
a first impurity region and a second impurity region in the first active region and respectively disposed at the first gate sidewall and the second gate sidewall,
wherein the first active region includes:
a first active central part that overlaps the first gate electrode;
a first active protrusion in which the first impurity region is disposed; and
a second active protrusion in which the second impurity region is disposed,
wherein the first device isolation part has a first isolation sidewall overlapping the first active central part, wherein the first isolation sidewall extends parallel to the second direction,
wherein a first straight line is at least partially spaced apart from the first isolation sidewall, wherein the first straight line links a first point to a second point, wherein the first point is where the first active protrusion meets the first active central part and is adjacent to the first isolation sidewall, and the second point is where the second active protrusion meets the first active central part and is adjacent to the first isolation sidewall, and
wherein the first isolation sidewall vertically overlaps the first gate electrode.

11. The image sensor of claim 10, further comprising a second device isolation part in the second unit pixel and defining a structured second active region, wherein the second active region has a shape different from a shape of the first active region.

12. The image sensor of claim 11, further comprising a second gate electrode and a third gate electrode that extend across the second active region and are spaced apart from each other.

13. The image sensor of claim 10, wherein
the first impurity region and the second impurity region have substantially the same size and the same shape as each other, and
a second straight line is not parallel to the second direction, wherein the second straight line links a center of the first impurity region to a center of the second impurity region.

14. The image sensor of claim 10, wherein
the first impurity region has a first width in the first direction,
the second impurity region has a second width in the first direction, wherein the second width is greater than the first width, and
a second straight line is parallel to the second direction, wherein the second straight line links a center of the first impurity region to a center of the second impurity region.

15. The image sensor of claim 10, wherein
the first device isolation part defines a second active region in the first unit pixel, wherein the second active region has a shape different from a shape of the first active region, and
the image sensor further comprises:
a transfer gate that covers at least a portion of the second active region; and
a floating diffusion region in the second active region on one side of the transfer gate.

16. A semiconductor device, comprising:
a device isolation part in a substrate and defining an active region;
a first gate electrode that extends in a first direction across the active region and has a first gate sidewall and a second gate sidewall that are spaced apart from each other in a second direction intersecting the first direction; and
a first impurity region and a second impurity region disposed in the active region and respectively adjacent to the first gate sidewall and the second gate sidewall,
wherein the device isolation part has a first isolation sidewall that vertically overlaps the first gate electrode, wherein the first isolation sidewall is parallel to the second direction,
wherein the first impurity region has a first corner point that is adjacent to the first isolation sidewall, wherein the first corner point is where the first impurity region meets the first gate sidewall,
wherein the second impurity region has a second corner point that is adjacent to the first isolation sidewall, wherein the second corner point is where the second impurity region meets the second gate sidewall, and
wherein a first straight line is at least partially spaced apart from the first isolation sidewall, wherein the first straight line links the first corner point to the second corner point.

17. The semiconductor device of claim 16, wherein the first straight line makes an acute angle with respect to the first isolation sidewall.

18. The semiconductor device of claim 16, wherein the first impurity region and the second impurity region have substantially the same size and the same shape as each other, and a second straight line is not parallel to the second direction, wherein the second straight line links a center of the first impurity region to a center of the second impurity region.

19. The semiconductor device of claim 16, wherein the first impurity region has a first width in the first direction, the second impurity region has a second width in the first direction, wherein the second width is greater than the first width, and a second straight line is parallel to the second direction, wherein the second straight line links a center of the first impurity region to a center of the second impurity region.

20. The semiconductor device of claim 16, further comprising:

a second gate electrode that extends in the first direction across the active region and is spaced apart from the first gate electrode, wherein the second gate electrode includes a third gate sidewall and a fourth gate sidewall, wherein the third gate sidewall is adjacent to the second impurity region, and the fourth gate sidewall is opposite to the third gate sidewall, and a third impurity region disposed in the active region and adjacent to the fourth gate sidewall, wherein the device isolation part further includes a second isolation sidewall that overlaps the second gate electrode, wherein the second isolation sidewall extends parallel to the second direction, wherein the second impurity region has a third corner point that is adjacent to the second isolation sidewall, wherein the third corner point is where the second impurity region meets the third gate sidewall, wherein the third impurity region has a fourth corner point that is adjacent to the second isolation sidewall, wherein the fourth corner point is where the third impurity region meets the fourth gate sidewall, and wherein a second straight line is at least partially spaced apart from the second isolation sidewall, wherein the second straight line links the third corner point to the fourth corner point.

\* \* \* \* \*